United States Patent
Chada et al.

(10) Patent No.: US 9,409,793 B2
(45) Date of Patent: Aug. 9, 2016

(54) SPIN COATABLE METALLIC HARD MASK COMPOSITIONS AND PROCESSES THEREOF

(71) Applicant: AZ ELECTRONIC MATERIALS (LUXEMBOURG) S.A.R.L., Somerville, NJ (US)

(72) Inventors: Venkata Gopal Reddy Chada, Bridgewater, NJ (US); Huirong Yao, Plainsboro, NJ (US); Salem Mullen, Florham Park, NJ (US); Elizabeth Wolfer, Bethlehem, PA (US); Alberto D. Dioses, Doylestown, PA (US); JoonYeon Cho, Bridgewater, NJ (US); Munirathna Padmanaban, Bridgewater, NJ (US)

(73) Assignee: AZ ELECTRONIC MATERIALS (LUXEMBOURG) S.A.R.L., Luxembourg (LU)

( * ) Notice: Subject to any disclaimer, the term of this patent is extended or adjusted under 35 U.S.C. 154(b) by 62 days.

(21) Appl. No.: 14/154,929

(22) Filed: Jan. 14, 2014

(65) Prior Publication Data
US 2015/0200090 A1   Jul. 16, 2015

(51) Int. Cl.
```
G03F 7/004    (2006.01)
C01G 31/00    (2006.01)
C01G 39/00    (2006.01)
C01G 41/00    (2006.01)
H01L 21/033   (2006.01)
```
(52) U.S. Cl.
CPC ............ *C01G 41/00* (2013.01); *C01G 31/00* (2013.01); *C01G 39/00* (2013.01); *G03F 7/0047* (2013.01); *H01L 21/0332* (2013.01)

(58) Field of Classification Search
CPC ....... G03F 7/0047; G03F 7/091; G03F 7/094; G03F 7/11; C01G 31/00; C01G 39/00; C01G 41/00
See application file for complete search history.

(56) References Cited

U.S. PATENT DOCUMENTS

| | | | |
|---|---|---|---|
| 3,474,054 A | 10/1969 | White | |
| 4,200,729 A | 4/1980 | Calbo | |
| 4,251,665 A | 2/1981 | Calbo | |
| 4,491,628 A | 1/1985 | Ito et al. | |
| 5,178,989 A * | 1/1993 | Heller et al. | 430/323 |
| 5,187,019 A | 2/1993 | Calbo et al. | |
| 5,292,558 A * | 3/1994 | Heller et al. | 438/643 |
| 5,350,660 A | 9/1994 | Urano et al. | |
| 5,512,417 A * | 4/1996 | Ban et al. | 430/270.14 |
| 5,772,978 A | 6/1998 | Bailey et al. | |
| 5,843,624 A | 12/1998 | Houlihan et al. | |
| 5,879,859 A | 3/1999 | Buchwalter et al. | |
| 6,242,156 B1 | 6/2001 | Teng | |
| 6,348,299 B1 | 2/2002 | Aviram et al. | |
| 6,447,980 B1 | 9/2002 | Rahman et al. | |
| 6,723,488 B2 | 4/2004 | Kudo et al. | |
| 6,790,587 B1 | 9/2004 | Feiring et al. | |

(Continued)

FOREIGN PATENT DOCUMENTS

| | | |
|---|---|---|
| EP | 2 477 775 A1 | 5/2012 |
| JP | 63-56529 A | 3/1988 |
| JP | 3-138922 A | 6/1991 |
| JP | 06-032756 * | 2/1994 |
| JP | 2000-10293 A | 1/2000 |
| JP | 2005-307101 * | 11/2005 |
| JP | 2006-98284 A | 4/2006 |
| JP | 2007-61720 A | 3/2007 |
| WO | WO 91/01516 A2 | 2/1991 |
| WO | WO 03/073164 A2 | 9/2003 |
| WO | WO 2012/099134 * | 7/2012 |

OTHER PUBLICATIONS

Machine translation of JP 2005-307101, published on Nov. 4, 2005.*

(Continued)

*Primary Examiner* — Anca Eoff
(74) *Attorney, Agent, or Firm* — Mitchell Brustein

(57) ABSTRACT

The present invention relates to a novel spin coatable composition comprising
(a) metallosilicic acid; (b) at least one compound comprising two or more 4-hydroxyphenyl groups; and, c) a solvent. The component b) can be a 4-hydroxyphenyl compound of structure (I) wherein W is a linking group chosen from the group consisting of an organic linking moiety, a heteroatom containing linking moiety and a direct valence bond, m is a positive integer of 1 and n is a positive integer equal to 1 or and $R^i$, $R^{ii}$, $R^{iii}$ and $R^{iv}$ are independently chosen substituents from a group consisting of hydrogen, ($C_1$-$C_6$) alkyl, ($C_1$-$C_6$) alkoxy, ($C_6$-$C_{20}$) aryl, halides (such as Cl, I, F), hydroxyl, alkylcarbonyl (alkyl-C(=O)—), alkylcarbonyloxy (alkyl-C(=O)—O—), alkyloxycarbonyl (alkyl-O—C(=O)—), alkyloxycarbonyloxy (alkyl-O—C(=O)—O—) and mixtures of these; and a solvent.

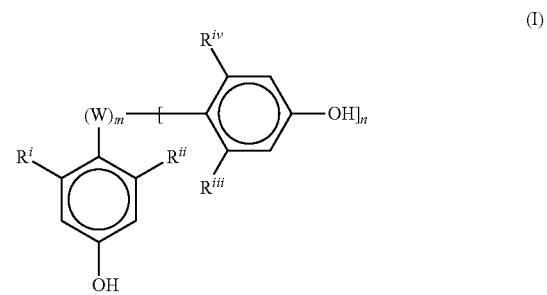

(I)

The present invention further relates to processes using the novel compositions.

14 Claims, 1 Drawing Sheet

(56) References Cited

U.S. PATENT DOCUMENTS

| | | | |
|---|---|---|---|
| 6,818,258 B2 | 11/2004 | Kaneko et al. | |
| 6,849,377 B2 | 2/2005 | Feiring et al. | |
| 6,866,984 B2 | 3/2005 | Jung et al. | |
| 6,916,590 B2 | 7/2005 | Kaneko et al. | |
| 7,416,834 B2 | 8/2008 | Abdallah et al. | |
| 7,727,902 B2 | 6/2010 | Takei et al. | |
| 7,767,368 B2 | 8/2010 | Fukushima et al. | |
| 7,799,396 B2 | 9/2010 | Uehara et al. | |
| 7,803,458 B2 | 9/2010 | Flaim et al. | |
| 8,039,201 B2 | 10/2011 | Yao et al. | |
| 8,568,958 B2 | 10/2013 | Yao et al. | |
| 2003/0235786 A1 | 12/2003 | Krishnamurthy et al. | |
| 2004/0058275 A1 | 3/2004 | Neef et al. | |
| 2004/0102048 A1 | 5/2004 | Yamaguchi | |
| 2004/0181031 A1* | 9/2004 | Nogi et al. | 528/480 |
| 2004/0224616 A1* | 11/2004 | Shiho et al. | 451/41 |
| 2005/0164133 A1 | 7/2005 | Rangarajan et al. | |
| 2006/0263708 A1 | 11/2006 | Wu et al. | |
| 2007/0015083 A1 | 1/2007 | Babich et al. | |
| 2007/0116640 A1 | 5/2007 | Kim et al. | |
| 2007/0134916 A1 | 6/2007 | Iwabuchi et al. | |
| 2007/0224483 A1 | 9/2007 | Alberti et al. | |
| 2007/0243473 A1 | 10/2007 | Mizushima et al. | |
| 2008/0039542 A1* | 2/2008 | Mills et al. | 522/31 |
| 2008/0044764 A1* | 2/2008 | Takahashi et al. | 430/280.1 |
| 2008/0076064 A1 | 3/2008 | Sun | |
| 2009/0239080 A1* | 9/2009 | Ito et al. | 428/411.1 |
| 2009/0286188 A1 | 11/2009 | Hatakeyama et al. | |
| 2010/0028804 A1 | 2/2010 | Iwato et al. | |
| 2010/0099044 A1 | 4/2010 | Hatakeyama et al. | |
| 2010/0130697 A1* | 5/2010 | Katayama et al. | 525/389 |
| 2011/0081615 A1 | 4/2011 | Kon | |
| 2011/0207864 A1 | 8/2011 | Nakamura et al. | |
| 2012/0108071 A1 | 5/2012 | Ogihara et al. | |
| 2012/0178261 A1 | 7/2012 | Kanno et al. | |
| 2012/0223418 A1 | 9/2012 | Stowers et al. | |
| 2012/0264039 A1 | 10/2012 | Ito et al. | |
| 2012/0288300 A1 | 11/2012 | Matsusaki et al. | |
| 2012/0328990 A1 | 12/2012 | Yao et al. | |
| 2013/0040140 A1 | 2/2013 | Joo et al. | |
| 2013/0123137 A1 | 5/2013 | Reichardt et al. | |
| 2014/0000948 A1* | 1/2014 | Nagai et al. | 174/258 |
| 2014/0159278 A1 | 6/2014 | Yao et al. | |
| 2014/0356792 A1 | 12/2014 | Noya | |
| 2015/0004801 A1 | 1/2015 | Rahman et al. | |
| 2015/0064904 A1 | 3/2015 | Yao et al. | |
| 2015/0200091 A1* | 7/2015 | Chada et al. | |

OTHER PUBLICATIONS

Machine translation of JP 06-032756, published on Feb. 8, 1994.*
International Search Report for PCT/JP2012/070426 date of mailing Sep. 4, 2012, which corresponds to U.S. Appl. No. 14/237,720.
Form PCT/ISA/220, Form PCT/ISA/210, and Form PCT/ISA/237 for PCT/IB2012/001219 dated Oct. 19, 2012, which corresponds to U.S. Appl. No. 13/164,869.
Form PCT/IB/326, Form PCT/IB/373, and Form PCT/ISA/237 for PCT/IB2012/001219 dated Jan. 9, 2014, which corresponds to U.S. Appl. No. 13/164,869.
Machine Language English Abstract from JPO of 3-138922 A, published on Jun. 13, 1991.
Machine Language English Abstract from JPO of JP 63-56529 A, published on Mar. 11, 1988.
"Alkyienes", PAC, 1995, 67, 1307, (Glossary of class names of organice compounds and reactivity intermediates based on structure (IUPAC Recommendations 1995) on p. 1314, obtained from hhttp://goldbook.iupac.org/!00227-plain.html on Mar. 11, 2013.
D. Abdallah et al., "Image Reversal Trilayer Process Using Standard Positive Photoresist", SPIE vol. 7273, No. 72732K, pp. 72732K-1—pp. 72732K-9 (2009).

D. Bajuk-Bogdanovic, "A Study of 12-tungstosilicic acid and 12-molybdophosphoric acids in solution," Journal of the Serbian Chemical Society vol. 73(2), pp. 197-pp. 209 (2008).
H. Levy et al., "Structure of Silico-Tungstic acid in Aqueous solution", The Journal of Chemical Physics vol. 30 No. 6, pp. 1486—pp. (1959).
J. Meador et al., "193-nm Multilayer Imaging Systems", SPIE vol. 5039, pp. 948-pp. 959 (2003).
J. Meador et al., "New Materials for 193-nm Trilayer Imaging", SPIE vol. 5376, pp. 1136-pp. 1148 (2004).
S. Moon et al, Three-Component Photopolymers Based on Thermal Cross-Linking and Acidolytic De-Cross-Linking of Vinyl Ether Groups. Effects of Binder Polymers on Photopolymer Characterictics, Chem. Mater. vol. 6, pp. 1854-pp. 1880 (1994).
M. Pope et al., "Polyoxymetalate Chemistry: An Old Field with New Dimensions in Several Disciplines", Angew. Chem. Int. Ed. Engl. vol. 30, pp. 34-pp. 48 (1991).
H. Schacht et al., "Acid Labile Cross-Liked Units: A Concept for Improved Positive Deep-UV Photoresists", ACS Symp. Ser. 706, pp. 78-pp. 94 (1998).
A. Scroggie et al., "The Crystal Structure of Anhydrous Silicotungstic Acid and Related Compounds, and Their Probable Molecular Formulas," Proceedings of the National Academy of Sciences vol. 15, No. 1, pp. 1-pp. 8 (1929).
T. Yamaoka et al., "Reactions of vinyl ethers and application to photoreactive process", Trends in Photochemistry and. Photobiology vol. 7, pp. 45-pp. 70 (2001).
Office Action notification date Mar. 31, 2015 for U.S. Appl. No. 13/930,711.
Form PCT/ISA/220, Form PCT/ISA/210, and Form PCT/ISA/237 for PPCT/EP2013/075815 dated Jul. 9, 2014 which corresponds to U.S. Appl. No. 13/707,993.
Baxendale et al., "The Reduction of Molybdenum(ll) Trifluoroacetate by Pulse Radiolysis in Methanols", Journal of the American Chemical Society vol. 98 No. 2, pp. 637-pp. 638 (1976).
Burch et al., "Scrambling of Fluoro-, Methoxyl, Dimethylamino-, and Methyl Gropus with Chlorine Atoms of Methoxyl with Dimethylaminal-Groups Germanium", J. Chm. Soc. (A), pp. 586-pp. 589 (1966).
Sartori et al., "Uber die Darstellung and Eigenschaften von Perflouracyloxy-Verbindungen der vieiten Gruppe des Periodensystems*", Chem. Ber. vol. 100 No. 6, pp. 2049-pp. 2063 (1967).
Notification of the First Office Action dated Sep. 1, 2014 from the Chinese Patent Office for CN2012800262639, which corresponds to U.S. Appl. No. 13/164,869.
English Translation of Notification of the First Office Action dated Sep. 1, 2014 from the Chinese Patent Office for CN2012800262639, which corresponds to U.S. Appl. No. 13/164,869.
Form PCT/ISA/220, Form PCT/ISA/210, and Form PCT/ISA/237 dated Aug. 11, 2014 for PCT/EP2014/063593 which corresponds to U.S. Appl. No. 13/930,711.
Satterfield, C. W., Heterogeneous Catalysis in Industrial Practice, 2nd Edition, McGraw-Hill, Inc., New York, Chapter 1, pp. 1-pp. 30 (1991).
Form PCT/ISA/220, Form PCT/ISA/210, and Form PCT/ISA/237 dated Nov. 28, 2014 for PCT/EP2014/067749, which corresponds to U.S. Appl. No. 14/015,222.
Office Action notification date Mar. 11, 2015 for U.S. Appl. No. 14/237,720.
Form PCT/ISA/220, Form PCT/ISA/210, and Form PCT/ISA/237 dated Feb. 6, 2015 for PCT/EP2014/076919, which corresponds to U.S. Appl. No. 14/015,222.
Restriction Requirement notification date Mar. 12, 2015 for U.S. Appl. No. 13/707,993.
Notice of Allowance and Fee(s) Due notification date Jun. 24, 2015 for U.S. Appl. No. 14/237,720.
Restriction Requirement notification date May 11, 2015 for U.S. Appl. No. 14/015,222.

* cited by examiner

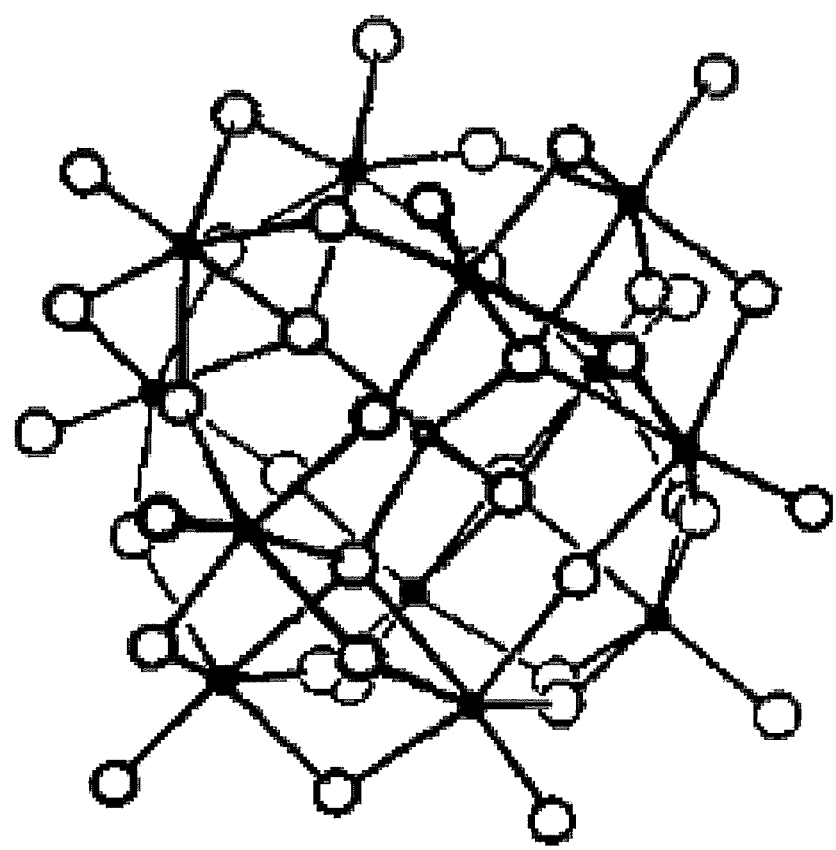
Structure of $XM_{12}O_{40}$

SPIN COATABLE METALLIC HARD MASK COMPOSITIONS AND PROCESSES THEREOF

FIELD OF INVENTION

The present invention relates to novel spin coatable compositions to generate metal-oxide rich films, and also relates to processes for via or trench filling, reverse via or trench filling and imaging with underlayers. The composition is useful for significantly improving moisture resistance for spin-on metal oxide materials. These materials are useful in wide range of applications in many industries, including the semiconductor industry.

GENERAL DESCRIPTION

Metal oxide films are useful in a variety of applications including the semiconductor industry, such as lithographic hardmasks, underlayers for antireflective coatings and electro-optical devices.

Photoresist compositions are used in microlithography processes for making miniaturized electronic components such as in the fabrication of computer chips and integrated circuits. Generally, a thin coating of a photoresist composition is applied to a substrate, such as silicon based wafer used for making integrated circuits. The coated substrate is then baked to remove a desired amount of solvent from the photoresist. The baked coated surface of the substrate is then image-wise exposed to actinic radiation, such as, visible, ultraviolet, extreme ultraviolet, electron beam, particle beam and X-ray radiation.

The radiation causes a chemical transformation in the exposed areas of the photoresist. The exposed coating is treated with a developer solution to dissolve and remove either the radiation-exposed or the unexposed areas of the photoresist.

The trend towards the miniaturization of semiconductor devices has led to the use of new photoresists that are sensitive to shorter and shorter wavelengths of radiation and has also led to the use of sophisticated multilevel systems to overcome difficulties associated with such miniaturization.

Absorbing antireflective coatings and underlayers in photolithography are used to diminish problems that result from radiation that reflects from substrates which often are highly reflective. An antireflective coating film coated beneath a photoresist and above a reflective substrate provides significant improvement in lithographic performance of the photoresist. Typically, the bottom antireflective coating is applied on the substrate and baked followed by application of a layer of photoresist. The photoresist is image-wise exposed and developed. The antireflective coating in the exposed area is then typically dry etched using various etching gases, and the photoresist pattern is thus transferred to the substrate.

Underlayers containing high amount of refractory elements can be used as hard masks and also as antireflective coatings. Hard masks are useful when the overlying photoresist is not capable of providing sufficient resistance to dry etching that is used to transfer the image into the underlying semiconductor substrate. In such circumstances a material called a hard mask is used whose etch resistance is sufficient to transfer any patterns created over it into the underlying semiconductor substrate. This is made possible because the organic photoresist, generally a material based on an organic polymer, etches at different rates compared to the underlying hard mask, where the underlying coating either contains refractory elements (e.g. Si, Ti, Zr, Hf, W, and the like) or has high carbon content. Due to these differences between the photoresist and hardmask it is possible to find an etch gas mixture which will allow the transfer of the image in the photoresist into the underlying hard mask. This patterned hard mask can then be used, with appropriate etch conditions and gas mixtures, to transfer the image from the hard mask into the semiconductor substrate, a task which the photoresist by itself with a single etch process could not have accomplished.

Multiple antireflective layers and underlayers are being used in new lithographic techniques. In cases where the photoresist does not provide sufficient dry etch resistance, underlayers and/or antireflective coatings for the photoresist that act as a hard mask and are highly etch resistant during substrate etching are preferred. One approach has been to incorporate silicon, titanium or other metallic materials into a layer beneath the organic photoresist layer. Additionally, another high carbon content antireflective or mask layer may be placed beneath the metal containing antireflective layer, such as a trilayer of high carbon film/hardmask film/photoresist is used to improve the lithographic performance of the imaging process. Conventional hard masks can be applied by chemical vapor deposition, such as sputtering. However, the relative simplicity of spin coating versus the aforementioned conventional approaches makes the development of a new spin coatable hard mask or antireflective coating with high concentration of metallic materials in the film very desirable.

The present invention relates to metal hardmasks for filling open topographical features present in a patterned material such as vias, trenches, contact holes or other similar features which consist of open spaces within a photoresist pattern. For instance, in this process a photoresist pattern containing such features such as trenches and/or vias is coated with a metal hardmask filling in the trenches and/or vias. In this process overcoating of the photoresist features occurs during via/trench filling, this overcoat may be removed by employing a short exposure with a plasma which erodes the hardmask quickly (e.g. a fluorine based plasma etch for Si containing hardmask materials or for other refractory metal based hardmasks which form volatile fluorides upon exposure to the fluorine plasma). Alternatively, this overcoat may also be removed by etching with a chemical solution, or by employing chemical mechanical polishing. These filled photoresist trenches and/or vias form a negative tone hardmask which act as an etch barrier when the non-filled areas of photoresist are removed with an appropriate plasma such as an oxygen plasma. This removes the photoresist faster than the hardmask filled areas to affect image tone reversal. Underlayer compositions for semiconductor applications containing metal oxides provide dry etch resistance as well as antireflective properties. Conventional soluble metal compounds to form metal oxide films, such as metal alkoxides, however, have been found to be very unstable as a result of moisture in air creating a variety of issues, including shelf life stability, coating problems and performance shortcomings. Previously known metal oxides had solubility problems in solvents typically accepted in the semiconductor industry.

Consequently, there is an outstanding need to prepare spin coatable hardmasks and other underlayers that are soluble in organic solvents, and can provide solutions of stable metal compounds which can act either as via or trench filling materials for patterned photoresist substrate or as underlayer materials. In via filling application, such materials act as negative tone hard masks to yield, after using an oxygen based plasma etching, a reverse tone image of the original photoresist pattern. In underlayer application such materials must be coatable on a substrate such as a carbon hardmask and this coating must then not dissolve when it is coated with a photoresist. The photoresist is patterned and is used as a mask to form, by using, wet or plasma etching (e.g. fluorine based plasma), a positive tone metal oxide hardmask. This positive tone metal hardmask can then be transferred into the substrate using appropriate plasma (e.g. oxygen). Furthermore, it is desirable that the metal oxide hardmask material be strippable by chemical solutions.

The present invention relates to a spin coatable metal oxide hardmask composition which has high content of the metal oxide and comprises a metallosilicic acid such as tungstosilicic acid or molybdosilicic acid, at least one 4-hydroxyphenyl compound and a solvent. This composition also forms good uality films when applied from a solvent onto a substrate, and has good planarizing qualities when applied from a solvent onto a patterned substrate. The novel composition retains stripability with a chemical solution even after application to a substrate, baking and pattern transfer.

SUMMARY OF THE DISCLOSURE

The present invention relates to novel spin coatable composition to form a film which has high metal-oxide content. The invention relates to a novel composition comprising a) metallosilicic acid; b) at least one compound comprising two or more 4-hydroxyphenyl groups; and c) a solvent. The compound comprising two or more 4-hydroxyphenyl groups may be a polymer. The compound comprising two or more 4-hydroxyphenyl groups may be of structure (I), wherein W is a linking group chosen from the group consisting of an organic linking moiety, a heteroatom containing linking moiety and a direct valence bond, m is a positive integer of 1 or greater and n is a positive integer of 1 or greater and $R^i$, $R^{ii}$, $R^{iii}$ and $R^{iv}$ are independently chosen substituents from a group consisting of hydrogen, ($C_1$-$C_6$) alkyl, ($C_1$-$C_6$) alkoxy, ($C_6$-$C_{20}$) aryl, halides (such as Cl, I, F), hydroxyl, alkylcarbonyl (alkyl-C(=O)—), alkylcarbonyloxy (alkyl-C(=O)—O—), alkyloxycarbonyl (alkyl-O—C(=O)—), alkyloxycarbonyloxy (alkyl-O—C(=O)—O—) and mixtures of these.

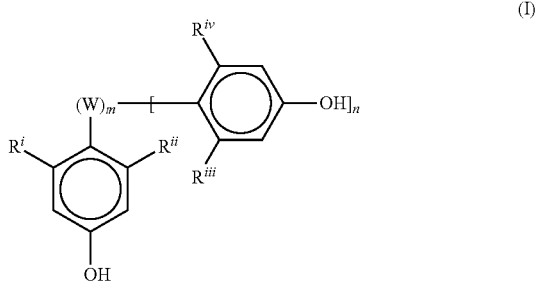

(I)

In one embodiment of the novel composition, the amount of metallosilicic acid a) ranges from about 55 wt % to about 95 wt % of total solids in the composition. In another embodiment the metal can be tungsten, molybdenum or vanadium.

In another embodiment the novel composition further comprises at least one crosslinker additive.

The present invention further relates to processes using the novel compositions to coat a film on a substrate, which may be a patterned substrate, such as a patterned photoresist. The invention also relates to using this filled photoresist pattern as a negative tone hardmask where the non-filled areas of photoresist are removed with appropriate plasmas such as oxygen plasma to cause image tone reversal. The invention also relates to removing the composition using a stripper, after baking and plasma transfer of the hardmask. The invention further relates to using the composition further comprising a crosslinker additive as an underlayer material.

BRIEF DESCRIPTION OF DRAWING

FIG. 1 relates to a possible structure of $XM_{12}O_{40}$ parent structure taken from Pope et al for Keggin ion in bound designation which corresponds to the anion $[SiW_{12}O_{40}]^{-4}$ derived from tungstosilicic acid.

DETAILED DESCRIPTION

As used herein, the conjunction "and" is intended to be inclusive and the conjunction "or" is not intended to be exclusive unless otherwise indicated. For example, the phrase "or, alternatively" is intended to be exclusive.

As used herein, the term "and/or" refers to any combination of the foregoing elements including using a single element.

As used herein, the terms "alkyl" refers to straight, or cyclic chain alkyl substituents as well as any of their branched isomers; "linear alkylene" refers to straight chain di-functionalized alkylene substituents having the general formula, —$(CH_2)_n$—, where n is an integer greater than 0; "branched alkylene" refers to an alkylene substituent which has alkyl substituents present; "cyclic alkylene" refers a disubstituted hydrocarbon moiety containing a cyclic hydrocarbon, the attachment points may either be on the cyclic hydrocarbon itself or on a pendant hydrocarbon substituent on the cyclic hydrocarbon; "alkylene" refers to linear, branched and cyclic alkylene; term "aryl" refers to any functional group or substituent derived from an aromatic ring, such as phenyl, naphthyl, anthracyl, thienyl, indolyl etc.; "diketone" refers to any solvent having two ketone groups non limiting examples are diacetyl, acetylacetone, and hexane-2,5-dione.

As used herein the term 4-hydrophenyl group refers to a phenyl group substituted with a hydroxyl moiety in which the attachment point of the phenyl moiety to other moieties is located para to the hydroxyl substituent. Other substituents may also be present on the 4-hydroxyphenyl moiety, but it is preferred that these are not located ortho to the hydroxyl substituent on the phenyl group.

As used herein the terms alkyl (based) linking group, branched alkyl (based) linking group, cycloalkyl (based) linking group, alicyclic (based) linking group, aryl (based) linking group refers to these moieties as linking groups (i.e. W in (I)) in which these groups link two or more 4-hydroxyphenyl moieties.

As used herein, the terms "composition" and "formulation" are used interchangeably and mean the same thing.

As used herein, the term "admixture" refers to a composition with the described component in which complexation and/or other secondary interactions may possibly be occurring between the components of the mixtures. In this application it may refer to possible complexation and other secondary interactions between metallosilicic acid and 4-hydroxyphenyl compounds.

The present invention relates to a novel spin coatable composition to generate metal-oxide rich films, where the composition comprises an admixture of a) metallosilicic acid; b) at least one compound comprising two or more 4-hydroxyphenyl groups; and c) a solvent. The compound comprising two or more 4-hydroxyphenyl groups may be a polymer. The compound comprising two or more 4-hydroxyphenyl groups may be of structure (I), wherein W is a linking group chosen from the group consisting of an organic linking moiety, a heteroatom containing linking moiety and a direct valence bond, m is a positive integer of 1 and n is a positive integer of 1 or greater and $R^i$, $R^{ii}$, $R^{iii}$ and $R^{iv}$ are independently chosen substituents from a group consisting of hydrogen, ($C_1$-$C_6$) alkyl, ($C_1$-$C_6$) alkoxy, ($C_6$-$C_{20}$) aryl, halides (such as Cl, I, F), hydroxyl, alkylcarbonyl (alkyl-C(=O)—), alkylcarbonyloxy (alkyl-C(=O)—O—), alkyloxycarbonyl (alkyl-O—C(=O)—), alkyloxycarbonyloxy (alkyl-O—C(=O)—O—) and mixtures of these.

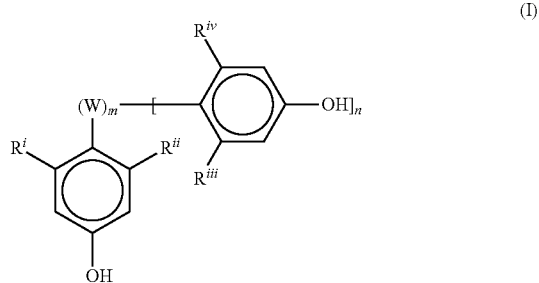

(I)

One particular embodiment of structure (I) is shown in structure (Ia) where $R^i$, $R^{ii}$, $R^{iii}$ and $R^{iv}$ are all hydrogen.

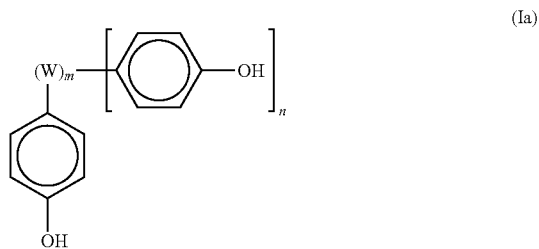

(Ia)

The metal in the metallosilicic acid can be any metal such as tungsten, molybdenum or vanadium. The metallosilicic acid may have the structure $H_4[Si(M_3O_{10})_4].xH_2O$, where M can be a metal such as tungsten or molybdenum. The tungstosilicic acid added to the novel composition is tungstosilicic acid (also called Silico-tungstic acid or 12-tungstosilicic acid) which can be described by various structures, such as the linear formula of $H_4[Si(W_3O_{10})_4].xH_2O$ with a molecular weight of 2878.17 (anhydrous basis) and also by the structural formulas $H_4SiW_{12}O_{40}$ (Levy et al "Structure of Silico-Tungstic acid in Aqueous solution," The Journal of Chemical Physics Volume 30, no 6, page 1486 (1959)); and the formula $2H_2O\cdot(6H_2O\cdot SiO_2O\cdot 12WO_3)$ or $H_4(H_{12}SiW_{12}O_{46})$ or $H_4[(SiO_4)(W_{12}O_{30})(OH)_{12}]$ (Scroggie et al "The crystal structure of anhydrous silicotungstic acid and related compounds, and their probable molecular formulas," Proceedings of the National Academy of Sciences Volume 15, No 1, page 1 (1929)) and also described for the corresponding anion as being $[SiW12O40]^{-4}$ by Bajuk-Bogdanovic ("A Study of 12-tungstosilicic acid and 12-molybdophosphoric acids in solution," Journal of Serbian Chemical Society volume 73(2), page 197 (2008)). The general 3-dimensional structure of similar polyoxometalate is discussed in Pope et al ("Polyoxymetalate Chemistry: An Old Field with New Dimensions in Several Disciplines," Angew. Chem. Int. Ed. Engl. Volume 30, page 34 (1991).

In general the structure of tungstosilicic acid can be described as follows: where a central silicon atom is surrounded with four oxygen atoms to form the group $SiO_4$. The $SiO_4$ group in turn forms the core of a shell of tungsten atoms which are arranged in a cube like form. The tungsten atom, in turn, which have a positive charge of six are surrounded by the required amount of hydroxyl groups and oxygen atoms at the corners of an octahedra. The four oxygens connected with silicon are shared with four of the tungsten atoms which thus have a different relationship in the structure from the other eight tungsten atoms. Each of the four unique tungsten atoms is connected with two other tungsten atoms by sharing in common an oxygen atom.

FIG. 1 provides an illustration of the possible $XM_{12}O_{40}$ parent structure taken from Pope et al (page 36) for a Keggin ion in bond designation which corresponds to the anion $[SiW_{12}O_{40}]^{-4}$ derived from tungstosilicic acid. The tungstosilicic acid can be purchased from Aldrich (Sigma-Aldrich Co. LLC, 3050 Spruce Street, St. Louis, Mo., USA.) In one embodiment, the amount of metallosilicic acid, like tungstosilicic acid, in the novel admixture composition ranges from about 55 wt % to about 95 wt % of total solids. In another embodiment, the amount of metallosilicic acid, like tungstosilicic acid in the novel admixture composition ranges from about 55 wt % to about 80 wt % of total solids. In another embodiment, the amount of metallosilicic acid, like tungstosilicic acid in the novel admixture composition ranges from about 55 wt % to about 65 wt % of total solids.

The second component in the admixture composition of this invention is component b) which is a compound comprising two or more 4-hydroxyphenyl groups. This compound may be a polymer or a small molecular compound. The compound comprising two or more 4-hydroxyphenyl groups may be of structure (I), which is a 4-hydroxyphenyl compound of structure (I) wherein W is a linking group chosen from the group consisting of an organic linking moiety, a heteroatom containing linking moiety and a direct valence bond, m is a positive integer of 1 or greater numerical value and n is a positive integer of 1 or greater numerical and $R^i$, $R^{ii}$, $R^{iii}$ and $R^{iv}$ are independently chosen substituents from a group consisting of hydrogen, ($C_1$-$C_6$) alkyl, ($C_1$-$C_6$) alkoxy, ($C_6$-$C_{20}$) aryl, halides (such as Cl, I, F), hydroxyl, alkylcarbonyl (alkyl-C(=O)—), alkylcarbonyloxy (alkyl-C(=O)—O—), alkyloxycarbonyl (alkyl-O—C(=O)—), alkyloxycarbonyloxy (alkyl-O—C(=O)—O—) and mixtures of these.

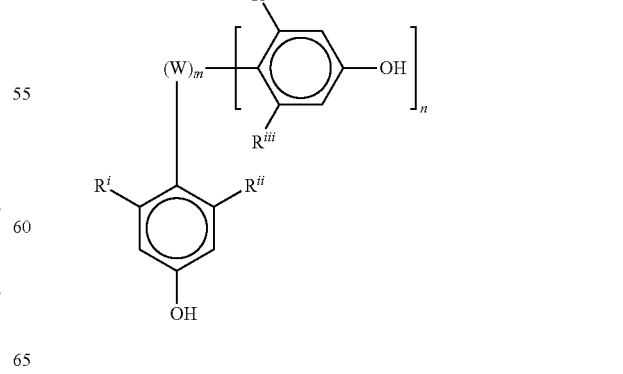

(I)

One particular embodiment of structure (I) is shown in structure (Ia) where $R^i$, $R^{ii}$, $R^{iii}$ and $R^{iv}$ are all hydrogen.

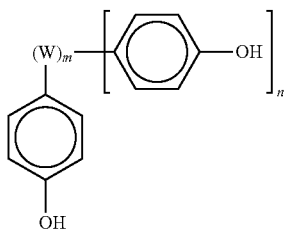

(Ia)

In one embodiment, the amount of 4-hydroxyphenyl compound in the admixture composition ranges from about 3 wt % to about 45 wt % of total solids. In another embodiment, the amount of 4-hydroxyphenyl compound in the admixture composition ranges from about 10 wt % to about 40 wt % of total solids. In another embodiment, the amount of 4-hydroxyphenyl compound in the admixture composition ranges from about 15 wt % to about 40 wt % of total solids. In structure (I) m can be 1, 2, 3, 4, 5, 6, 7, 8, 9, 10, or greater. One embodiment of structure (I) is shown in structure (Ib) where $R^i$, $R^{ii}$, $R^{iii}$ and $R^{iv}$ are all hydrogen and m is 1.

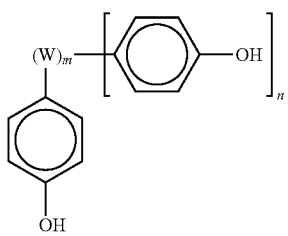

(Ib)

An organic linking moiety of structure (I) in the present invention is defined as a hydrocarbon (such as saturated alkyl, unsaturated alkyl, aromatic or mixture thereof) based linking moiety. This hydrocarbon organic linking moiety may be a large hydrocarbon based linking group, such as a polymer backbone with multiple repeat units or a small hydrocarbon linking group. W is a multifunctional linking moiety where at least two moieties bearing a 4-hydroxyphenyl moiety are attached to it (i.e. n in (I or Ia or Ib) is 1 or greater).

The small hydrocarbon based linking groups, generally where in structure (I) m is 1 or in structure Ia, are chosen from a group of linear or branched alkyl based linking groups ($C_1$-$C_{30}$), cycloalkyl based linking groups ($C_4$-$C_{30}$), alicyclic based linking groups ($C_6$-$C_{30}$), aryl based linking groups ($C_6$-$C_{20}$) and mixtures thereof. Examples of aryl based linking groups are phenyl, naphthyl, anthracyl and the like. All these moieties are attached to 2 or more 4-hydroxyphenyl moieties as shown in (I) and (Ia).

The aforementioned small hydrocarbon linking moiety comprising alkyl based linking groups, may contain one or several carbon-carbon double bond or triple bond. Similarly the linking group comprising cyclic or alicyclic linking groups may also contain one or more double bonds.

All these small organic hydrocarbon linking moieties may be optionally substituted with one or more substituents such as ($C_1$-$C_6$) alkyl groups, ($C_1$-$C_6$) alkoxy group, ($C_6$-$C_{20}$) aryl group, halide atoms (Cl, I, F), hydroxyl, alkylcarbonyl (alkyl-C=O—), alkylcarbonyloxy (akyl-C=O—O—), alkyloxycarbonyl (alkyl-O—C=O—), alkyloxycarbonyloxy (akyl-O—C=O—O—) or mixtures of these.

When the aforementioned hydrocarbon based organic linking moieties contain one or more carbon-carbon double bonds, or one or more carbon-carbon triple bond, it is envisaged that the hydrocarbon linking moiety may be a single moiety comprised of either a substituted or unsubstituted carbon-carbon double (i.e. ethene linking group). This single ethene linking group may be a difunctional ethene linking group, a trifunctional ethene group, or a tetrafunctional ethene linking group in which for the ethene linking group which are difunctional or trifunctional, additional substituents may be present on the alkene in place of hydrogen and chosen from the group consisting of $C_1$-$C_4$ alkyl, or phenyl. It is also envisaged that the hydrocarbon linking moiety may be a single moiety comprising a single carbon-carbon triple bond (i.e. acetylenic linking group also known as acetylene linking group). Additionally, in one embodiment of (I) or (Ia) no substituents are present on the 4-hydroxyphenyl moiety other than the single attachment point at the para position to the hydroxyl group and the attachment point to the remainder of the molecule.

In one embodiment excessive fluorination of the organic moieties is avoided, such as perfluorinated organic moieties, which may lead to incompatibility with standard spin casting solvent.

When the organic moiety, W (between at least two 4-hydroxyphenyl moieties) is a large hydrocarbon moiety based on a polymeric moiety, this polymeric moiety may comprise either repeat units free of pendant 4-hydroxyphenyl moiety, contain pendant 4-hydroxyphenylmoieties or a mixture of these two types of repeat units. W is also comprised of the repeat unit to which the "at least two" 4-hydroxyphenyl moieties are attached.

Non limiting examples of suitable repeat units that may comprise W if this is based on a polymeric moiety or the polymer comprising 2 or more hydroxyphenyl groups are those derived from monomers such as acrylates, methacrylates, styrenic monomers, vinylic monomers, and vinyloxy monomers. Such repeat units may either be free of a pendant 4-hydroxyphenyl moiety or have such moieties attached to them as described as follows.

When the polymeric moiety contains repeat units comprising pendant 4-hydroxyphenyl units itself, these moieties may be attached to the repeat unit directly, or attached to this repeat unit through a spacer such as an alkylene spacer, oxygen spacer, or alkyleneoxy spacer. Specific non limiting examples of suitable monomers from which these repeat units containing a 4-hydroxymoiety can be derived from are 4-hydroxystyrene, 4-hydroxyphenyloxymethacrylate, and 4-hydroxyphenyloxyacrylate. Such monomers may also be employed to generate the two 4-hydroxyphenyl moieties in (I, Ia or Ib).

When the polymer contains repeat units free of 4-hydroxyphenyl moiety, specific non limiting examples of monomers from which these repeat units may be derived are unsubstituted or substituted alkyl ($C_1$-$C_{20}$) acrylates or methacrylate (e.g. methyl methacrylate, ethyl methacrylate, tert-butyl acrylate, tert-butyl methacrylate and the like), unsubstituted or substituted cycloalkyl ($C_3$-$C_{26}$) acrylates or methacrylate (e.g. cyclohexylmethacrylate, 1-methylcyclopentyl methacrylate, and the like), unsubstituted or substituted cycloalicyclics ($C_6$-$C_{30}$) acrylates or methacrylate (e.g. adamantyl methacrylate, norbornyl methacrylate, 1-methyladamantyl methacrylate and the like), substituted or unsubstituted styrenes, ($C_1$-$C_{20}$) (e.g. alpha methyl styrene, 4-t-butyloxycarbonyloxystyrene, acetal or ketal derivatives of 4-hydroxystyrene and the like), alkyl($C_1$-$C_{20}$) vinyl ethers (e.g. methyl vinyl ether, tert-butyl vinyl ether and the like) alkyl ($C_1$-$C_{20}$) vinyl hydrocarbons (e.g. propene and the like), alkyl ($C_1$-$C_{20}$), and vinyl carboxylates ($C_1$-$C_{20}$) (e.g. vinyl acetates, vinyl propionate and the like).

All these monomers from which the repeat units are derived may optionally be substituted with one or more substituents. Examples of suitable substituents are ($C_1$-$C_6$) alkyl groups, ($C_1$-$C_6$) alkoxy, ($C_6$-$C_{20}$) aryl group, halide atoms (Cl, I, F), hydroxyl, alkylcarbonyl (alkyl-C=O—), alkylcarbonyloxy (akyl-C=O—O—), alkyloxycarbonyl (alkyl-O—C=O—), alkyloxycarbonyloxy (akyl-O—C=O—O—). However, in one embodiment excessive fluorination, as is present for instance in perfluorinated monomers moieties is avoided. This is because such polymers may have incompatibility with standard spin casting solvent. Thus, there is one embodiment in which non-fluorinated polymers backbone are employed as organic linking moieties. There is also an embodiment in which no substituents are present on the 4-hydroxyphenyl moiety other than the single attachment point at the para position to the hydroxyl group.

A heteroatom containing linking moiety is defined as a linking moiety which contains at least one hetero atom. Examples of heteroatom linking groups are such as those chosen from oxygen, sulfur or mixtures thereof, and may further contain carbon. Specific examples of such linking groups are oxygen (—O—), sulfone (—$SO_2$—), carbonate (—O—C=O—O—), carbonyl (—C=O—), oxycarbonyl (—O—C=O—), sulfide (—S—), or linking ($C_1$-$C_{20}$) alkylene moieties containing one or more oxy, sulfone, carbonate, oxycarbonyl or sulfide moieties and the like.

In one embodiment, the 4-hydroxyphenyl compounds described by (I) has no substituents located ortho to the hydroxyl on the phenyl group. Although not bound by theory, it is postulated that this enables the phenolic moiety to have greater ability to coordinate, react or otherwise interact with the metallic centers present in tungstosilicic acid to form the novel admixture composition.

Non limiting examples of structure (I) with different W organic groups are illustrated by group i), ii), iii) and iv).

Group i) is a 4-hydroxyphenyl containing compound which is a polymer comprising repeat units having the structure (II);

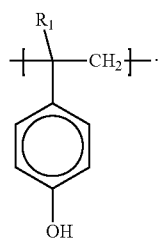

(II)

wherein $R_1$ is chosen from hydrogen or $C_1$-$C_4$ alkyl. The polymer may be a homopolymer or copolymers with 2 or more different repeating units.

Group ii) is a 4-hydroxyphenyl containing compound having structure (III),

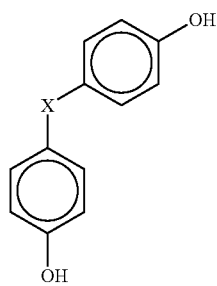

(III)

where X is chosen from a group consisting of a direct valence bond, $C_1$-$C_8$ linear or branched alkylene moiety, a phenylene moiety, a sulfone moiety, an oxygen moiety, a carbonyl moiety, an acetylene linking moiety, a phenylene linking moiety and mixtures thereof.

Group iii) is a 4-hydroxyphenyl containing compound comprising the structure (IV),

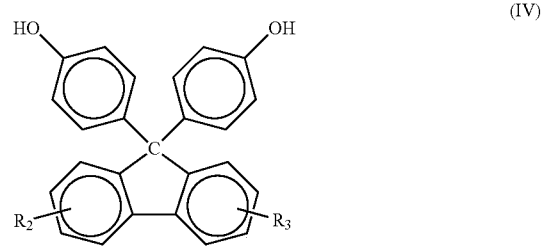

(IV)

where $R_2$ and $R_3$ are independently chosen from the group consisting of hydrogen, $C_1$-$C_8$ linear alkyl, $C_3$-$C_{12}$ branched alkyl, $C_3$-$C_8$ cycloalkyl, $C_6$-$C_{12}$ alicyclic alkyl and mixtures thereof.

Group iv) is a 4-hydroxyphenyl containing compound comprising structure (V)

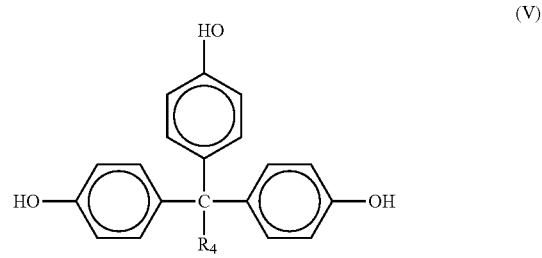

(V)

where $R_4$ is chosen from the group consisting of hydrogen, $C_1$-$C_8$ n-alkyl, $C_3$-$C_{12}$ branched alkyl, $C_3$-$C_8$ cycloalkyl; $C_6$-$C_{12}$ alicyclic alkyl, phenyl and 4-hydroxyphenyl and mixtures thereof.

In the embodiment where the 4-hydroxyphenyl compound is a polymer, and the polymer may have a Mw ranging from 1,000 to 25,000 and a polydispersity (pd) ranging from 1.0 to about 3.

The polymer may be a homopolymer comprised of at least two repeat units on which a 4-hydroxyphenyl moiety is attached. In one embodiment the repeat unit bearing a 4-hydroxyphenyl moiety comprise from 0.10 to 1.0 mole fraction based on total repeat units in the polymer, while other repeat unit not bearing a 4-hydroxyphenyl moiety may range from about 0 to 0.90 mole fraction. In another embodiment the repeat unit bearing a 4-hydroxyphenyl ranges from about 0.40 to 0.70 mole fraction, while the repeat unit not bearing the 4-hydroxyphenyl moiety ranges from 0.30 to 0.60.

In another embodiment the repeat unit containing a 4-hydroxyphenyl moiety has structure (II). In this embodiment at least two such repeat unit must be present. In another embodiment where the repeat unit has structure (II) it is present from about 1.0 to about 0.10 mole fraction while other repeat units not bearing a 4-hydroxyphenyl moiety range from about 0 to about 0.90. In another example of this embodiment, structure (II) comprises from about 0.40 to 0.70 mole fraction while that of other repeat units not bearing a 4-hydroxyphenyl moiety range from about 0.30 to 0.60.

The polymer may comprise more than one type of repeat unit II, wherein the $R_1$ substituents differ.

Furthermore, in any of the above embodiments the secondary repeat unit not bearing a 4-hydroxyphenyl moiety may be chosen from the group consisting of repeat units having structure (VI) and (VII) wherein $R_5$ and $R_7$ are independently chosen from $C_1$-$C_4$ alkyl, and $R_6$ and $R_8$ are independently chosen from the group consisting of $C_1$-$C_8$ linear alkyl, $C_3$-$C_{12}$ branched alkyl, $C_3$-$C_5$ cycloalkyl, $C_6$-$C_{12}$ alicyclic alkyl, acid labile group and mixtures thereof. Examples of acid cleavable groups are C—O—C or C—O—Si bonds. For example, and without limitation, acid cleavable groups include acetal or ketal groups formed from alkyl or cycloalkyl vinyl ethers, silyl ethers formed from suitable trimethylsilyl or t-butyl(dimethyl)silyl precursors, alkyl ethers formed from methoxymethyl, methoxyethoxymethyl, cyclopropylmethyl, cyclohexyl, t-butyl, amyl, 4-methoxybenzyl, o-nitrobenzyl, or 9-anthrylmethyl precursors, t-butyl carbonates formed from t-butoxycarbonyl precursors, and carboxylates formed from t-butyl acetate precursors, and t-butoxycarbonylmethyl. More than one type of this type of secondary repeat units may be present in the polymer.

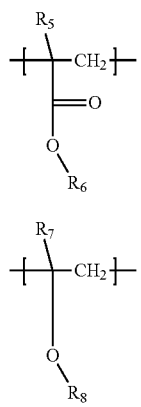

(VI)

(VII)

One particular embodiment of the compound is when the 4-hydroxystyrene containing polymer has the structure (VIIIa) wherein x and y are the mole fraction of the monomer repeat units present in the 4-hydroxystyrene containing polymer.

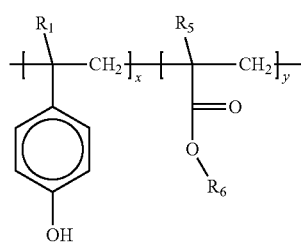

(VIIIa)

Another embodiment of (VIIIa) is where $R_1$ is hydrogen and $R_5$ is methyl and $R_6$ is a $C_1$-$C_4$ linear alkyl; more specifically, where $R_1$ is hydrogen and $R_5$ is methyl and $R_6$ is methyl.

In structure (VIIIa) the mole fraction of x ranges from 1.0 to 0.10 and the mole fraction of y ranges from 0 to 0.90. More specifically in structure (VIIIa) the mole fraction of x can range from 0.40 to 0.70 and the mole fraction of y ranges from 0.30 to 0.60. Even more specifically in structure (VIIIa) the mole fraction of x can range from 0.40 to 0.60 and the mole fraction of y ranges from 0.40 to 0.60.

Another embodiment of the compound is where the 4-hydroxystyrene containing polymer has structure (VIIIb) wherein x and y are the mole fraction of the monomer repeat units present in the 4-hydroxystyrene containing polymer.

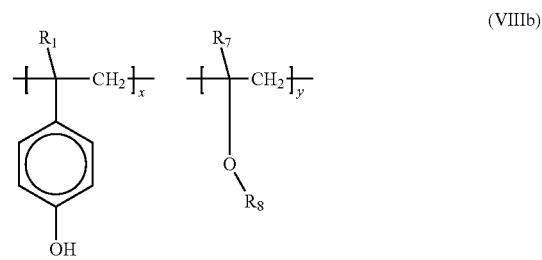

(VIIIb)

A more specific embodiment of the above is when $R_1$ is hydrogen and $R_7$ is methyl and $R_8$ is a $C_1$-$C_4$ linear alkyl; and more specifically still, where $R_1$ is hydrogen and $R_7$ is methyl and $R_8$ is methyl. In structure (VIIIb) the mole fraction of x ranges from 1.0 to 0.10 and y mole fraction ranges from 0.0 to 0.90. More specifically, in structure (VIIIb) the mole fraction of x can range from 0.40 to 0.70 and the mole fraction of y ranges from 0.30 to 0.60. Even more specifically in structure (VIIIb) the mole fraction of x can range from 0.40 to 0.60 and the mole fraction of y ranges from 0.40 to 0.60.

In both structures VIIIa and VIIIb it is within the scope of the invention that additional repeat units may also be present in the polymer, which may be of types represented by structure VI or VII. Additionally, in both structure VIIIa and VIIIb more than one type of phenolic unit I may be present in the polymer in which the $R_1$ substituent described above differ from each other. Other repeat units derived from aryl vinyl compounds may be present in which the aryl moiety may be unsubstituted or substituted with a $C_1$-$C_8$ alkyl, alkylcarbonyloxy, alkyloxycarbonyloxy or alkoxy substitutent. The aryl group may be phenyl or a fused aromatic ring such as naphthyl, anthracenyl, pyrenyl and the like. Examples of suitable unsubstituted aryl vinyl compounds which can be polymerized are as follows.

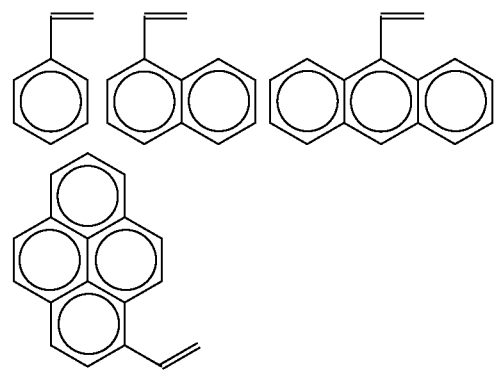

Another embodiment of the present invention is where the novel composition comprises a 4-hydroxyphenyl containing compound of structure (IV), has structure (IX).

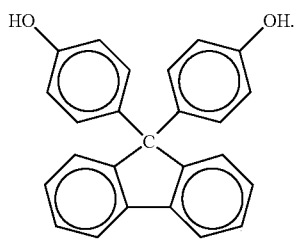
(IX)

Another embodiment of this invention is where the composition of the 4-hydroxyphenyl comprises compounds of structure (III), where non-limiting examples of suitable compounds which may be employed are as follows:

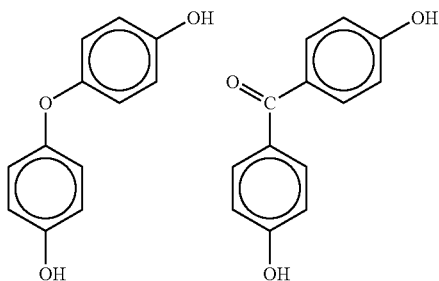

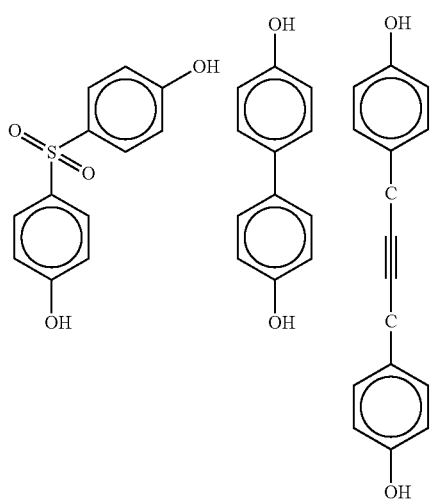

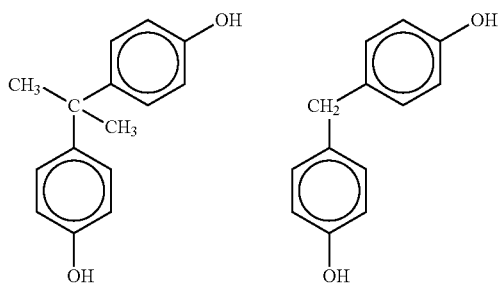

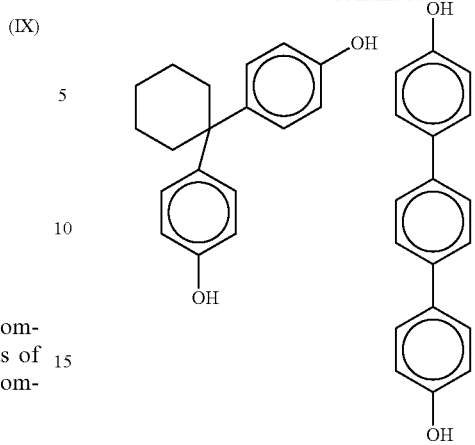

Another embodiment of the present invention is where the novel composition has as component b) a 4-hydroxyphenyl containing compound of structure (V), where a specific non-limiting example of this embodiment is a where the compound has structure (X).

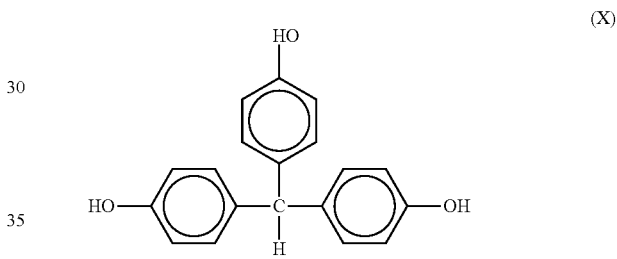
(X)

Another embodiment of the present invention is where mixtures of the 4-hydroxyphenyl compounds belonging to groups i), ii), iii) and iv) are contained in the novel composition. These may be binary, tertiary or quaternary mixtures of these materials. Mixture of polymeric and non-polymeric 4-hydroxyphenyl compound may also be used. Specific examples of such mixtures are as follows; mixtures of 4-hydroxyphenyl polymer containing repeat units of structure (II) with 4-hydroxyphenyl compounds of either structures III, IV or V. Non polymeric 4-hydroxyphenyl compounds of structures III, IV and V may also be mixed together. Finally, these mixtures may also contain mixtures of 4-hydroxyphenyl compound belonging to one specific class (e.g i), ii), iii) or iv)), but which has different structures within this same class; non limiting examples of which would be mixture of 4-hydroxyphenyl polymers belonging to class i) but having different secondary repeat units.

The third component c) of the present novel composition is a solvent which dissolves the solid components of the composition. The solvent may be chosen from a solvent or solvent mixture containing an alcohol, an ether, an ester, a ketone, a carboxylic acid, an amide, an aromatic moiety, or a diketone. Specific non-limiting examples of suitable solvents are lower alcohols ($C_1$-$C_6$) such as isopropanol, n-butanol, t-butanol, 1-pentanol and 4-methyl-2-pentanol, a glycol such as ethylene glycol and propylene glycol, diketones such as diacetyl, acetylacetone, and hexane-2,5-dione, a glycol ether derivative such as ethyl cellosolve, methyl cellosolve, propylene glycol monomethyl ether, diethylene glycol monomethyl ether, diethylene glycol monoethyl ether, dipropylene glycol dimethyl ether, propylene glycol n-propyl ether, or diethylene glycol dimethyl ether; a glycol ether ester derivative such as ethyl cellosolve acetate, methyl cellosolve acetate, or propylene glycol monomethyl ether acetate; carboxylates such as ethyl acetate, n-butyl acetate and amyl acetate; carboxylates of di-basic acids such as diethyloxylate and diethylmalonate; dicarboxylates of glycols such as ethylene glycol diacetate and propylene glycol diacetate; and hydroxy carboxylates such as methyl lactate, ethyl lactate, ethyl glycolate, and ethyl-3-hydroxy propionate; a ketone ester such as methyl pyruvate or ethyl pyruvate; an alkoxy alcohol such as 1-methoxy-2-propanol, 2-methoxyethanol, ethoxyethanol, an alkoxycarboxylic acid ester such as methyl 3-methoxypropionate, ethyl 3-ethoxypropionate, ethyl 2-hydroxy-2-methylpropionate, or methylethoxypropionate; a ketone derivative such as methyl ethyl ketone, acetyl acetone, cyclopentanone, cyclohexanone or 2-heptanone; a ketone ether derivative such as diacetone alcohol methyl ether; a ketone alcohol derivative such as acetol or diacetone alcohol; lactones such as butyrolactone and gamma-velaro lactone; an amide derivative such as dimethylacetamide or dimethylformamide, aromatic solvents such as anisole, and mixtures thereof.

In one embodiment, the weight % of solids in solution ranges from about 3 wt % to about 30 wt %. In another embodiment, the wt % of solids in solution ranges from about 10 wt % to about 25 wt %. In another embodiment, the wt % of solids in solution ranges from about 15 wt % to about 22 wt %.

The novel composition of the present invention may contain other components. For instance, the composition may further comprise a surfactant or leveling agent. Also, the composition of this invention may further comprise at least one of a thermal acid generator, a thermal base generator, or a thermally activated peroxide. Additionally, the composition of the present invention may further comprise a crosslinking additive which is useful as underlayer coatings. For example, a photoresist might be coated on top of the underlayer coating requiring the underlayer to be insoluble in the solvent employed to coat the photoresist.

Examples of surfactants or leveling agents can be polyethylene glycol dodecyl ether, polyoxyethylene oleyl ether, polyethylene glycol octadecyl ether, polyethylene glycol tert-octylphenyl ether, fluorine based surfactant, and silicon based surfactant. Surfactants with the following trade names may be used, Brij30, Brij52, Triton X-100, FC4430, KP341, Tween 80 and the like.

The composition of the present invention may contain additional polymer components such as, for example, poly (meth)acrylics, poly(meth)acrylates, and condensation polymers such as polyesters, novolac resins, siloxane resins or organosilsesquioxanes.

Optionally, a crosslinker may be added to the novel composition, when the composition is employed as an underlayer coating over which other materials such as photoresists are to be coated. The underlayer is resistant to an aqueous base developer such as tetramethylammonium hydroxide and to the solvent(s) for any coatings coated over it. Underlayer applications may also be used as antireflective coatings or as a hard mask layer. Crosslinkers that may be useful for the underlayer applications of this invention include small molecule crosslinkers and crosslinking polymers. Examples of small molecule crosslinker are materials such as bisphenol A-based epoxy compounds, bisphenol F-based epox compounds, bisphenol S-based epoxy compounds, the novolac resin-based epoxy, poly(hydroxystyrene)-based epoxy compounds, melamine compounds, benzoguanamine compounds, and urea compounds. Crosslinking polymeric additives may be used alone or in combination with each other depending on the desired properties of the final film after baking. These crosslinking polymers, contain any of a number of the same or different crosslinking substituents, such as, for example, epoxy, hydroxy, thiols, amines, amides, imides, esters, ethers, ureas, carboxylic acids, anhydrides, and the like. Other examples of crosslinking groups include the glycidyl ether group, glycidyl ester group, glycidyl amino group, methoxymethyl group, ethoxy methyl group, benzloxymethyl group, dimethylamino methyl group, diethylamino methyl group, dimethylol amino methyl group, diethylol amino methyl group, morpholino methyl group, acetoxymethyl group, benzyloxy methyl group, formyl group, acetyl group, vinyl group, isopropenyl group, and vinyl ether group.

Particularly useful as crosslinker components for the novel composition are small molecules or polymers that can act as an electrophile and can, alone or in the presence of an acid, form a carbocation. Thus compounds containing groups such as alcohol, ether, ester, olefin, methoxymethylamino, methoxymethylphenyl and other molecules containing multiple electrophilic sites, are capable of crosslinking with the novel admixture composition comprising a 4-hydroxyphenyl compound and tungstosilicic acid. Polymeric crosslinkers may be used, such as polymers of glycoluril, melamine, and the like. Examples of compounds which can be electrophilic crosslinkers are, 1,3 adamantane diol, 1,3, adamantane triol, polyfunctional reactive benzylic compounds, tetraalkoxymethyl-bisphenol ($C_1$-$C_4$ alkyls) compounds such as tetramethoxymethyl-bisphenol (TMOM-BP) of structure (XI), aminoplast crosslinkers, glycolurils, Cymels, Powderlinks, and the like.

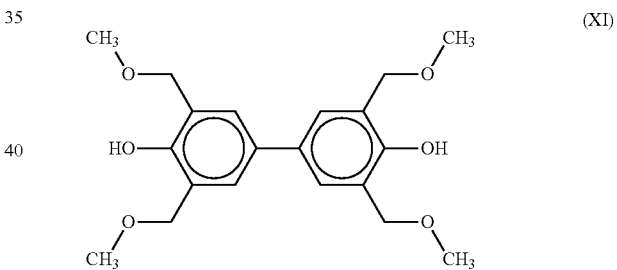

Further examples of crosslinking compounds are compounds with multiple vinyloxy groups which can act as vinyl ether terminated crosslinking agents and can be represented by the general structure (XII):

wherein $R^1$ is selected from ($C_1$-$C_{30}$) linear, branched or cyclic alkyl, substituted or unsubstituted ($C_6$-$C_{40}$) aryl, or substituted or unsubstituted ($C_7$-$C_{40}$) alicyclic hydrocarbon; and n is an positive integer greater or equal to 2. Examples of such vinyl ether terminated crosslinking agents include bis (4-vinyloxy butyl) adipate; bis(4-vinyloxy butyl) succinate; bis(4-vinyloxy butyl) isophathalate; bis(4-vinyloxymethyl cyclohexylmethyl) glutarate; tris(4-vinyloxy butyl)trimellitate; bis(4-vinyloxy methyl cyclohexyl methyl) terephthalate; bis(4-vinyloxy methyl cyclohexyl methyl) isophthalate; bis(4-vinyloxy butyl) (4-methyl-1,3-phenylene)biscarbamate; bis(4-vinyloxy butyl)(methylene di-4,1-phenylene)bis-carbamate; and triethyleneglycol divinylether, 1,4-cyclohexanedimentanol divinyl ether, various vinyl ether monomers available under the tradename Vectomer, such as, for example, 4-(vinyloxy)butyl benzoate, bis[4-(vinyloxy)butyl] adipate, bis[4-(vinyloxy)butyl]succinate, 4-(vinyloxymethyl)cyclohexylmethyl benzoate, bis[4-(vinyloxy)butyl] isophthalate, bis[4-(vinyloxymethyl)cyclohexylmethyl] glutarate, tris[4-(vinyloxy)butyl]trimellitate, 4-(vinyloxy) butyl stearate, bis[4-(vinyloxy)butyl] hexanediylbiscarbamate, bis[[4-[(vinyloxy)methyl] cyclohexyl]methyl]terephthalate, bis[[4-[(vinyloxy)methyl] cyclohexyl]methyl]isophthalate, bis[4-(vinyloxy)butyl] (methylenedi-4,1-phenylene)biscarbamate, bis[4-(vinyloxy) butyl](4-methyl-1,3-phenylene)biscarbamate, and polymers bearing pendant vinyloxy groups. Other vinyl ether terminated crosslinking agents are described in T. Yamaoka, et al., Trends in Photochem. Photobio., 7:45 (2001); S. Moon, et al., Chem. Mater., 6:1854 (1994); or H. Schacht, et al., ACS Symp. Ser. 706:78 (1998), which may also be used and are incorporated herein by reference. In one embodiment the multifunctional vinyl ethers is 1,2,4-cyclohexyltricarboxylicacid-butylvinylester, also known by the systematic name tris[4-(vinyloxy)butyl]1,2,4-cyclohexyltricarboxylate (CHTA-BVE) of structure (XIII).

(XIII)

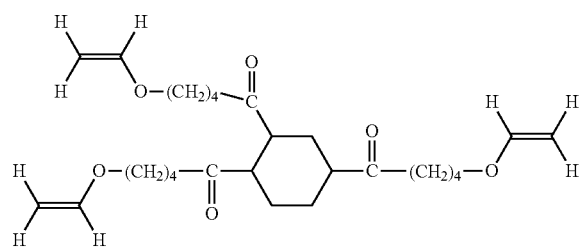

One or more different crosslinkers may be present. Crosslinkers may be added to the novel composition comprised in an amount ranging from about 1 wt % to about 20 wt % total solids. In another embodiment crosslinker may present from about 1 wt % to about 10 wt % of total solids in the composition. In another embodiment crosslinkers may be present in about 2 wt % to about 4 wt % of total solids.

Thermally activated catalysts are materials such as thermal acid generators (TAG), may also be added to the novel composition to aid in crosslinking during thermal curing of the coated composition for use in underlayer applications. The thermal acid generator can be activated at above 90° C. for example above 120° C., and above 150° C. Examples of thermal acid generators include metal-free sulfonium salts and iodonium salts, such as triarylsulfonium, dialkylarylsulfonium, and diarylakylsulfonium salts of strong non-nucleophilic acids alkylaryliodonium, diaryliodonium salts of strong non-nucleophilic acids; and ammonium, alkylammonium, dialkylammonium, trialkylammonium, tetraalkylammonium salts of strong non nucleophilic acids. 2-nitrobenzyl esters of alkyl or arylsulfonic acids and other esters of sulfonic acid which thermally decompose to give free sulfonic acids. Other examples include diaryliodonium perfluoroalkylsulfonates, diaryliodonium tris(fluoroalkylsulfonyl)methide, diaryliodonium bis(fluoroalkylsulfonyl)methide, diaryliodonium bis(fluoroalkylsulfonyl)imide, diaryliodonium or quaternary ammonium perfluoroalkylsulfonate. Examples of labile esters: 2-nitrobenzyl tosylate, 2,4-dinitrobenzyl tosylate, 2,6-dinitrobenzyl tosylate, 4-nitrobenzyl tosylate; benzenesulfonates such as 2-trifluoromethyl-6-nitrobenzyl 4-chlorobenzenesulfonate, 2-trifluoromethyl-6-nitrobenzyl 4-nitro benzenesulfonate; phenolic sulfonate esters such as phenyl, 4-methoxybenzenesulfonate; quaternary ammonium tris(fluoroalkylsulfonyl)methide, and quaternaryalkyl ammonium bis(fluoroalkylsulfonyl)imide, alkyl ammonium salts of organic acids, such as triethylammonium salt of 10-camphorsulfonic acid, or other similar materials. triethylammonium salt of dodecylbenzenesulphonic acid (DBSA/ E). A variety of aromatic (anthracene, naphthalene or benzene derivatives) sulfonic acid amine salts can be employed as the TAG, including those disclosed in U.S. Pat. Nos. 3,474,054, 4,200,729, 4,251,665 and 5,187,019. A specific example of an embodiment is an amine salt of an aromatic sulfonic acid such as triethylammonium salt of dodecylbenzenesulphonic acid (DBSA/E). The TAG may have a released acid which possesses very low volatility at temperatures between the temperatures of 170-220° C.

In one embodiment the novel composition comprises from 1 wt % to 20 wt % total solids of the thermal acid generator, or from 2 wt % to about 10 wt % total solids, or from about 2 wt % to about 4 wt % total solids. In one embodiment the composition contains both a thermal acid generator and a crosslinker and could be either the crosslinkers TMOM-PB or CHTA-BVE present in the admixture at a levels of 1 to 10 wt % of total solids and the quantity of the total triethylammonium dodecylbenzenesulfonic (DBSA/E) is 1 to 10 wt % of total solids. In another embodiment these materials are present in the range of 2 to 4 wt % of total solids.

When using crosslinker additives which contain moieties such as olefinic group susceptible to radical reactions, thermally activated peroxides may also be used in the current composition when employed in underlayer applications. Non limiting examples of such materials are benzoyl peroxide, 3,5-dichlorobenzoperoxide and the like.

The invention also relates to a method of manufacturing an electronic device or a process comprising applying the novel composition comprising a) tungstosilicic acid; (b) 4-hydroxyphenyl compound(s); and c) a solvent as described above onto a substrate and baking the film to produce a film.

The compositions of the current disclosure can be coated onto the surface of a substrate such as low dielectric constant materials, silicon, silicon substrates coated with a metal surface, copper coated silicon wafer, copper, aluminum, polymeric resins, silicon dioxide, metals, doped silicon dioxide, silicon nitride, tantalum, polysilicon, ceramics, aluminum/ copper mixtures, any of the metal nitrides such as AlN; gallium arsenide and other such Group III/V compounds; or a photoresist pattern. The substrate may also be other antireflective coatings or underlayers, such as high carbon underlayers coated over the above mentioned substrates. The substrate may comprise any number of layers made from the materials described above. In such underlayer application, as discussed above, an additional crosslinker component may be added as disclosed.

More specifically, the novel process also relates to a method of applying the novel composition on to a substrate where the substrate is a patterned photoresist to form a coating. The photoresist pattern can be vias, trenches, holes or other hollow topographical features. The method comprises baking the novel coating wherein after baking the film the method further comprises the steps of removing the composition overlaying the top of the patterned photoresist, and, removing the photoresist with oxygen plasma, thereby forming a negative tone image of the original patterned resist.

Specifically, the composition may also be coated onto a patterned substrate using techniques well known to those skilled in the art as described above. The patterned substrate may be any patterned substrate for instance as a non-limiting example a photoresist patterned with features comprised of vias, trenches, holes, and/or other hollow topographical features. The film thickness of the coating on patterned substrates ranges from about 20 nm to about 600 nm, such as, for example, about 60 nm to about 400 nm depending on the depth of topographical features in the photoresist pattern. The coating may be further heated on a hot plate or convection oven for a sufficient length of time to remove a majority of the solvent and optionally to induce curing. The baking temperature may be from about 200° C. to about 600° C. for about 30 seconds to about 10 minutes, such as, for example, from about 220° C. to about 350° C. for about 1 to about 2 minutes. The composition of the film after baking contains between about 60 to about 95 wt % of total metal oxide or between about 60 to about 80 wt % of total metal oxide, or between about 60 to about 70 wt % of total metal oxide.

After baking, it is advantageous for novel composition to exhibit the least amount of film shrinkage because this will lessen stress issues which may be induced during chemical vapor deposition of material on photoresist features filled with the composition of this invention. Generally, the amount of shrinkage experienced during bake should be minimized as much as possible. In one embodiment this shrinkage is 20% or less. In another embodiment this skrinkage is 17% or less. In another embodiment this shrinkage is 15% or less.

The baked tungstosilicic acid/4-hydroxyphenyl compound film of the novel composition or residual hard mask, after oxygen plasma based pattern transfer, can be advantageously removed using a chemical stripping agent, such as acid, base, peroxide, and mixture thereof. For example, 85% phosphoric acid, diluted sulfuric acid, 3% HF, 10% TMAH, 10% hydrogen peroxide, aqueous alkaline peroxides and mixtures thereof are useful stripping compounds. Stripping time ranges from about 5 seconds to about 120 seconds at about room temperature to about 70° C. depending on the film curing conditions. Other stripping processes may be employed in conjunction with processing conditions of the tungsten oxide film. For example, when the film is baked at a lower temperature or a shorter time, the stripper may be diluted, the time may be shortened and/or the temperature of stripping may be reduced or alternatively when baked at low temperature without a crosslinking agent (i.e. not cured) the baked coating may be strippable with the original coating solvent.

In addition to the method of use of the currently disclosed composition, these compositions and methods can also be used to prepare antireflective coatings. When used as an underlayer coating requiring the coating of a photoresist in solvent over the novel film, these compositions require an additional crosslinker component. In this application sufficient chromophore groups (e.g. the inherently present 4-hydroxyphenyl groups, other aryl substitutents, alkyl, branched alkyl or cycloalkyl group containing a carbon-carbon double bond) must be present, such that the refractive indices n (refractive index) ranges from about 1.4 to about 2.0 while k (extinction coefficient) (part of the complex refractive index $n_c = n - jk$) ranges from about 0.1 to about 0.8 at 193 nm exposure wavelength. The n and k values can be calculated using an ellipsometer, such as the J. A. Woollam WVASE VU-32™ Ellipsometer. The exact values of the optimum ranges for k and n are dependent on the exposure wavelength used and the type of application. Typically for 193 nm the preferred range for k is about 0.1 to about 0.8, and for 248 nm the preferred range for k is about 0.15 to about 0.8. However, other exposure wavelengths such as, for example shorter wavelengths such as 157 nm or extreme ultraviolet from 124 nm down to 10 nm (EUV) and beyond EUV can be used and the compositions tuned to work in conjunction with them.

In one application of this invention a photoresist is coated on the novel coating while in the other application the novel coating is applied to an imaged photoresist film containing vias and/or trenches to act as a filling compound. The former application requires the use of a crosslinker component, as previously discussed, while the second application does not.

Photoresists can be any of the types used in the semiconductor industry, provided the photoactive compound in the photoresist and the antireflective coating substantially absorb at the exposure wavelength used for the imaging process. Photoresists useful for immersion lithography are preferred. Typically, photoresists suitable for imaging with immersion lithography may be used, where such photoresists have a refractive index higher than 1.85 and also are hydrophobic having water contact angle in the range of 75° to 95°.

To date, there are several major deep ultraviolet (uv) exposure technologies that have provided significant advancement in miniaturization, and have actinic radiation of 250 nm to 10 nm, such as 248 nm, 193 nm, 157 and 13.5 nm. Chemically amplified photoresist are often used. Photoresists for 248 nm have typically been based on substituted polyhydroxystyrene and its copolymers/onium salts, such as those described in U.S. Pat. No. 4,491,628 and U.S. Pat. No. 5,350,660. On the other hand, photoresists for exposure at 193 nm and 157 nm require non-aromatic polymers since aromatics are opaque at this wavelength. U.S. Pat. No. 5,843,624 and U.S. Pat. No. 6,866,984 disclose photoresists useful for 193 nm exposure. Generally, polymers containing alicyclic hydrocarbons are used for photoresists for exposure below 200 nm. Alicyclic hydrocarbons are incorporated into the polymer for many reasons, primarily since they have relatively high carbon to hydrogen ratios which improve etch resistance, they also provide transparency at low wavelengths and they have relatively high glass transition temperatures. U.S. Pat. No. 5,843,624 discloses polymers for photoresist that are obtained by free radical polymerization of maleic anhydride and unsaturated cyclic monomers. Any of the known types of 193 nm photoresists may be used, such as those described in U.S. Pat. No. 6,447,980 and U.S. Pat. No. 6,723,488, and incorporated herein by reference. Two basic classes of photoresists sensitive at 157 nm, and based on fluorinated polymers with pendant fluoroalcohol groups, are known to be substantially transparent at that wavelength. One class of 157 nm fluoroalcohol photoresists is derived from polymers containing groups such as fluorinated-norbornenes, and are homopolymerized or copolymerized with other transparent monomers such as tetrafluoroethylene (U.S. Pat. No. 6,790,587, and U.S. Pat. No. 6,849,377) using either metal catalyzed or radical polymerization. Generally, these materials give higher absorbencies, but have good plasma etch resistance due to their high alicyclic content. More recently, a class of 157 nm fluoroalcohol polymers was described in which the polymer backbone is derived from the cyclopolymerization of an asymmetrical diene such as 1,1,2,3,3-pentafluoro-4-trifluoromethyl-4-hydroxy-1,6-heptadiene (U.S. Pat. No. 6,818,258) or copolymerization of a fluorodiene with an olefin (U.S. Pat. No. 6,916,590). These materials give acceptable absorbance at 157 nm, but due to their lower alicyclic content as compared to the fluoro-norbornene polymer, have lower plasma etch resistance. These two classes of polymers can often be blended to provide a balance between the high etch resistance of the first polymer type and the high transparency at 157 nm of the second polymer type. Photoresists that absorb extreme ultraviolet radiation (EUV) of 13.5 nm are also useful and are known in the art. Thus photoresists absorbing in the range of about 12 nm to about 250 nm are useful. The novel coatings can also be used in process with nanoimprinting and e-beam resists.

After the coating process, the photoresist is imagewise exposed. The exposure may be done using typical exposure equipment. The exposed photoresist is then developed in an aqueous developer to remove the treated photoresist. The developer is preferably an aqueous alkaline solution comprising, for example, tetramethylammonium hydroxide (TMAH), typically 2.38 weight % TMAH. The developer may further comprise surfactant(s). An optional heating step can be incorporated into the process prior to development and after exposure.

The process of coating and imaging photoresists is well known to those skilled in the art and is optimized for the specific type of photoresist used. The photoresist patterned substrate can then be dry etched with an etching gas or mixture of gases, in a suitable etch chamber to remove the exposed portions of the underlayers and optional other anti-reflective coatings. Various etching gases are known in the art for etching underlayer coatings, such as those comprising $O_2$, $CF_4$, $CHF_3$, $Cl_2$, HBr, $SO_2$, CO, and the like.

In one embodiment, the article comprises a photoresist substrate patterned with vias and/or trenches, over which the novel composition of the present invention is coated. The photoresist was initially imaged to produce vias and/or trenches as disclosed above. The photoresist film with vias, trenches, holes or other hollow topographical features patterned in the in the substrate has these features filled with the novel composition of the current disclosure. This is done by coating the composition of the current disclosure onto the patterned photoresist and baking the film. Then, any composition of the present invention overlaying the top of the patterned resist is removed by either, etching it away employing a fluorine based plasma, by etching with a chemical solution, or by chemical mechanical polishing. The vias trenches, holes and/or other hollows topographical features filled with the composition of the current disclosure where the top of the resist features are free of the composition of the current disclosure are then dry plasma etched using gases comprising oxygen using the tungsten oxide filled vias, trenches, holes or other filled hollow topographical resist features as a hard mask to form a negative tone image in the substrate of the original patterned photoresist by selectively removing the resist areas not filled with the composition of the current disclosure.

Moreover, since tungsten oxide films have low volumetric shrinkage compared to other metal oxides, it is harder to generate film defects, such as voids. Also, these formulations can advantageously be removed comparatively easily by wet etching etc.

Advantageously, after plasma transfer of the image to the substrate, the residual composition of the current disclosure can be removed using a chemical stripping agent, such as the original casting solvent, acid, base, peroxide, and mixture thereof. For example, 85% phosphoric acid, diluted sulfuric acid, 3% HF, 10% TMAH, 10% hydrogen peroxide, aqueous alkaline peroxides and mixtures thereof. Stripping time ranges from about 5 seconds to about 120 seconds at about room temperature to about 70° C. depending on the film curing conditions. Other stripping processes may be employed in conjunction with processing conditions of the tungsten oxide film. For example, when the film is baked at a lower temperature or a shorter time, the stripper may be diluted, the time may be shortened and/or the temperature of stripping may be reduced. If the film is not cured (i.e crosslinked), the tungsten hard mask can be removed with the casting solution.

Each of the documents referred to above are incorporated herein by reference in its entirety, for all purposes. The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLES

The refractive index (n) and the extinction coefficient (k) values of the examples tungsten oxide coatings below were measured on a J. A. Woollam VASE32 ellipsometer.

Thermogravetric measurements use to measure W wt % were done using A Perkin Elmer Thermogravimetric Analyzer TGA7 with heating from 50° C. to 800° C. at a heating rate of 120° C./min in a $O_2$ atmosphere and maintaining this temperature for 60 minutes.

Elemental analysis used to measure tungsten (W) wt. % and silicon (Si) content were done by Intertek of Whitehouse N.J.

Method for Determination of Tungsten Oxide Wt. % in Cured Films

The weight % of tungsten oxide in the metallic underlayer films were measured by elemental analysis and TGA (Thermogravetric Analysis) weight loss measurement. The results from two methods were consistent. The measured total oxide content ranged from 60 to 95 wt % in films baked at 220° C./60 s or 600° C./60 s. The film mostly comprised of tungsten silicic oxide compounds.

Spin Coating Process for Metal Hardmasks, Via or Trench Filling

The spin coating of the formulation examples was done by depositing a solution of each formulation onto the center of a substrate (e.g. silicon wafer) and then spinning the substrate at high speed (typically between 1000 to 3000 rpm). Specifically, an OptiTRAC, Photoresist Coater and Developer was employed to coat bare substrates or to coat substrates with patterned photoresist to accomplish via or trench filling. An adjusted solids content of formulation targeting a final film thickness of 250 nm was employed in spin-coating on a deep via substrate patterned wafer with trench sizes of 600 nm to 650 nm (depth) 70 nm to 100 nm (width) and line/space (L/S) 1:1. The coated wafer was subsequently baked at 250° C./60 s to 600° C./60 s. For trench filling, solids content of the formulations was adjusted to target a final film thickness of 80 nm which was spin-coated on a patterned wafer with trench size of 70 nm (depth)×30 nm (width) and L/S 1:1. The coated wafer was subsequently baked at 220° C./60 s, 250° C./60 s.

Formulation Moisture Sensitivity Tests

The solutions of formulation examples 1, 2, 3, 4 and 5 were exposed to air (bottle open) for 1 h, 5 h, 8 h, 10 h, 14 h, 16 h, 20 h and 24 h (h is hour). After closing the bottles, the samples are subjected to long term stability test by coating the solution periodically e.g. 1 week, etc. and examined for the coating quality/soaking test performances. The formulation was spin coated on a silicon wafer and baked at 220-600° C./60 s. The films of these formulations demonstrated good coating quality (no particles/voids) even after 8 h to 24 h exposure to air and for at least 1 week.

Soak Test

The soaking tests were performed as follows: After the coating process, the film was baked at different temperatures. The baked thin film was developed with either organic solvent such as ArF thinner (mixture of PGMEA/PGME) or aqueous developer such as AZ-MIF 300. The developer is preferably an aqueous alkaline solution comprising, for example, tetramethylammonium hydroxide (TMAH), typically 2.38 weight % TMAH.

Materials and Instruments

The chemical which we used here were purchased from different vendors.

The following chemicals were purchased from Sigma-Aldrich Co. LLC, 3050 Spruce Street, St. Louis, Mo., USA: tungstosilicic acid hydrate (TSA); polyacrylic acid (Mw 1800) (PAA); BisPhenol A; Dihydroxybiphenyl; 2,2'-1,1'-Bi-2-naphthol; Dodecylbenzenesulfonic acid; Triethyamine.

The following chemicals were purchased from TCl Chemicals 9211 North Harborgate Street, Portland, Oreg., USA: 9,9'-Bis(4-hydroxyphenyl)fluorine (THTPM); poly(4-hydroxystyrene) also called Poly(4-vinylphenol) (PHS); nonylphenol (NP).

The following chemical was purchased from Dupont Electronic Technologies, 14785 Preston Road, Dallas, Tex. 75254, USA: Electronic polymer; poly(4-hydroxystyrene-co-methylmethacrylate) (PHS/MMA) 55/45 (Mw 13,000).

The following chemical was purchased from Nippon Carbide, 93 Yokoyama-cho, Sukagawa-shi, Fukushima 962-0041, Japan: 1,2,4-cyclohexyltricarboxylicacid-Butylvinylester (CHTA-BVE).

The following chemical was purchased from Cytec Industries Inc., 5 Garret Mountain Plaza, Woodland Park, N.J. 07424, USA: Novolak resin (SPN-560).

The following chemical is available from AZ® Electronic Materials USA Corp., 70 Meister Ave, Somerville, N.J. 08876, USA: Propylene glycol monomethyl ether acetate/propylene glycol monomethyl ether (PGMEA/PGME (70:30).

The following chemical was purchased from Honshu Chemical Industry Co. Ltd., 5-115, 2-Chome Kozalka, Wakayama, Japan; Tetramethoxymethyl-bisphenol (TMOM-BP).

Polytetrafluoroethylene (PTFE) membrane (size 0.20 um) discs were used in the filtration of the formulations (from Thermo Scientific, 75 Panorama creek Drive, Rochester, N.Y., USA) applications.

Prepared thin films from above inorganic, organic additive formulations were characterized by Scanning Electron microscopy (SEM, Hitachi Model S-4700, from Hitachi High Technologies America, Inc., 1375 North 28th Avenue, Dallas, Tex., USA), Tungsten weight percentage measured by Graphite furnace atomic absorption spectroscopy (GF-AA, PinAAcle 900Z Atomic Absorption Spectrometer, from Perkin-Elmer, 940 Winter Street, Waltham, Mass., USA) and Thermo gravimetric analysis (TGA, from Perkin-Elmer Thermo gravimetric Analyzer TGA7, 940 Winter Street, Waltham, Mass., USA).

The above processes were used for the following examples e. g. "Spin Coating Process for Metal Hardmasks," and other general processing and analysis procedures described above for details on the processes involved.

Formulation Example 1a 30 g of a formulation was made by dissolving 3.315 g of tungstosilicic acid (TSA) in 24.9 g of mixture of PGMEA/PGME (70:30) solvent and 1.7850 g of 9,9'-Bis(4-hydroxyphenyl) fluorene was added into the reaction vessel at room temperature. This solution was stirred and maintained at constant temperature for 5 hours, and then filtered using a 0.2 um micron PTFE filter. The spin coating was done on a Si wafer at a 1500 rpm speed. The measured total metal oxide content was 67 wt. % in coated films, as measured by TGA after baking at 300° C. for 60 s. The formulation showed some slight film roughness.

Formulation Example 1b

This formulation was prepared, filtered, coated and baked as for example 1 b, except that the weight ratios of tungstosilicic acid and 9,9'-bis(4-hydroxyphenyl) fluorene were changed. 30 g of formulation was made by dissolving 3.1875 g of tungstosilic acid and 1.9125 g of 9,9'-bis(4-hydroxyphenyl) fluorene in 24.9 g PGMEA/PGME solvent. This formulation's via filling performance showed much improvement over Example 1a. The measured total metal oxide content was 62 wt. % in films after baking at 300° C. for 60 s. This formulation had no detectable surface roughness.

Formulation Example 2a 30 g of this formulation was prepared by dissolving 3.6210 g tungstosilicic acid, and 1.4790 g poly(4-hydroxystyrene-co-methyl methacrylate) (PHSMMA) in a mixture of 1 g de-ionized water and a 23.9 g of PGMEA/PGME (70:30) solvent. This solution was reacted, filtered and coated as in Examples 1a. The measured total metal oxide content was 70 wt. % in coated films after baking at 300° C. for 60 s. This formulation showed good film quality, and via filling performance where all the vias were completely filled. The measured total metal oxide content was 67 wt. % in films after baking at 300° C. for 60 s. Other examples of this formulation at different levels of PHSMMA processed with different bake temperatures are shown in Table 1a.

Formulation Example 2b

This formulation was prepared as in Example 2a, but with a higher amount of PHSMMA in the formulation as follows; a 30 g formulation was prepared by dissolving 3.2130 g TSA and 1.887 g PHSMMA in a mixture of 1 g $H_2O$ and 23.9 g of PGMEA/PGME (70:30) solvent. This solution was reacted, filtered and coated as in Example 1a. This formulation also showed good via filling, maintaining smooth coating on top of the vias. Other examples of this formulation, at different levels of PHSMMA, and processed with different bake temperatures are shown in Table 1a.

Formulation Example 2c 20 g of this formulation was prepared by dissolving 2.18 g of tungstosilicic acid, 0.7265 g of PHSMMA (Mw 13,000) in 16.07 g of PGMEA/PGME (70:30) solvent. These solutions were stirred and maintain constant temperature for 5 hours. To this solution was next added 0.436 g of TMOM-BP crosslinker, and 0.58 g of DBSA/E [2% in PGMEA/PGME (70:30)]; the solution mixed for another 5 hours, and then filtered using a 0.2 µm micron PTFE filter. The spin coating was done on a Si wafer at a 1500 rpm speed. These cross linkable tungstosilicic acid formulations are discussed in more detail and compared to formulation without crosslinker, as follows, and as described in Table 6.

Formulation Example 2d 20 g of this formulation was prepared by dissolving 2.18 g of tungstosilicic acid, 0.7265 g of PHSMMA (55/45)(Mw 13,000) in 16.07 g of PGMEA/PGME (70:30) solvent. This solution was stirred and maintained at constant temperature for 5 hours. To this solution was next added 0.436 g of CHTA-BVE cross linkable agent, 0.58 g of DBSA/E [2% in PGMEA/PGME (70:30)] and the solution was mixed for another 5 hours, and then filtered using a 0.2 um micron PTFE filter. The spin coating was done on a Si wafer at a 1500 rpm speed. These cross linkable tungstosilicic acid formulations are discussed in more detail and compared to formulation without crosslinker, as follows, and as described in Table 6.

Formulation Example 3

20 g of this formulation was prepared by dissolving 3.0 g (66.6 wt. %) of tungstosilicic acid, 1.5 g (33.3 wt. %) of poly(4-hydroxystyrene) (Mw 11 k or 25 k) in 15.5 g of PGMEA/PGME (70:30) solvent. This solution was reacted, filtered and coated as in Example 1a. The solution was clear and transparent. The measured total metal oxide content was 70 wt. % in films after baking at 300° C. for 60 s. Other examples of this formulation at different levels of PHS processed with different bake temperatures are shown in Table 1a and discussed below.

Formulation Example 4a 50 g of this formulation was prepared by dissolving 5.52 g of tungstosilicic acid, 2.97 g of 4,4',4"-Trihydroxytriphenyl-methane (THTPM) in 41.5 g of PGMEA/PGME (70:30) solvent. This solution was reacted, filtered and coated as in Example 1a. The measured total metal oxide content was 73 wt. % in films after baking at 300° C. for 60 s. Other examples of this formulation at different levels of THTPM processed with different bake temperatures are shown in Table 1a and discussed below.

Formulation Example 4b 50 g of this formulation was prepared by dissolving 6.37 g of tungstosilicic acid, 2.12 g of THTPM in 41.25 g of PGMEA/PGME (70:30) solvent. This solution was stirred and maintained at constant temperature for 5 hours and then filtered using a 0.2 um micron PTFE filter. To this solution was next added 0.25 g of Megafac (10%) surfactant and it was mixed for another 5 hours, and then filtered using a 0.2 um micron PTFE filter. The spin coating was done on a Si wafer at a 1500 rpm speed. Other examples of this formulation at different levels of THTPM processed with different bake temperatures are shown in Table 1a and discussed below.

Formulation Example 4c 50 g of this formulation was prepared by dissolving 6.80 g of tungstosilicic acid, 1.7 g of THTPM in 41.5 g of PGMEA/PGME (70:30) solvent. This solution was stirred and maintained at constant temperature for 5 hours. To this solution was next added 0.25 g of Megafac (10%) surfactant and the solution was mixed for another 5 hours and then filtered using a 0.2 um micron PTFE filter. Other examples of this formulation at different levels of THTPM processed with different bake temperatures are shown in Table 1a and discussed below.

Formulation Example 5

20 g of this formulation was prepared by dissolving 2.27 g of tungstosilicic acid, 1.12 g of Bis-phenol A in 16.6 g of PGMEA/PGME (70:30) solvent. This mixture was stirred and maintained at constant temperature for 5 hours and then filtered using a 0.2 um micron PTFE filter. The spin coating was done on a Si wafer at 1500 rpm speed. The measured total metal oxide content was 69 wt. % in films after baking at 300° C. for 60 s.

Comparative Formulation Example 1

30 g of this formulation was made by adding 4.5 g of tungstosilicic acid, dissolved in 24 g of PGMEA/PGME (70:30) solvent to 1.50 g of polyacrylic acid (PAA) (Mw 1800). This solution was reacted, filtered and coated as in Example 1a. The measured total metal oxide content was 70 wt. % in films after baking at 300° C. for 60 s. However, this formulation gave poor via filling properties (Table 1b).

Comparative Formulation Example 2

20 g of this formulation was prepared by dissolving 2.27 g of tungstosilicic acid, 1.12 g of 4-Nonylphenol (NP) in 16.6 g of PGMEA/PGME (70:30) solvent. This solution was reacted, filtered and coated as in Example 1a. This gave a clear solution. Films coated from this formulation were baked at different temperatures ranging from 240-300° C. for 60 s. However, regardless of bake temperature, this formulation gave poor via filling properties (Table 1b).

Comparative Formulation Example 3

20 g of this formulation was prepared by dissolving 2.27 g of tungstosilicic acid, 1.12 g of 2,2'-dihydroxybiphenyl (DHBP) in 16.6 g of PGMEA/PGME (70:30) solvent. This solution was reacted, filtered and coated as in Example 1a. This formulation mixture solution was clear and transparent. The spun films were baked at 300° C. for 60 s. However, this formulation gave poor via filling properties (Table 1b).

Comparative Formulation Example 4

20 g of comparative formulation example 2 prepared by dissolving 2.27 g of tungstosilicic acid, 1.12 g of 1,1'-Bis-2-naphthol (B2N) in 16.6 g of PGMEA/PGME (70:30) solvent. This solution was reacted, filtered and coated as in Example 1a. The resultant solution was clear and transparent. Spun films were baked at different baking temperatures ranging from 240 to 300° C. for 60 seconds. However, under any bake condition this formulation gave poor via filling properties (Table 1b). For example, when film baked at 300° C./60 sec the coating gave much outgassing and film quality was very poor compare to other organic additives.

Comparative Formulation Example 5

20 g of comparative formulation example 5 prepared by dissolving 2 g of tungstosilicic acid, 1 g of Novolak (46.9% in PGMEA) resin (SPN-560) in 16 g of PGMEA/PGME (70:30) solvent. This solution was reacted, filtered and coated as in Example 1a. This formulation mixture solution was clear, but had a light red color. Spun films of this material were baked at different temperatures ranging from 240 to 300° C. for 60 s. However, in all cases this formulation gave poor via filling properties (Table 1b). Specifically, for example, when the coated film was baked at 300° C./60 sec, the film showed a lot of cracks.

Comparison of Coating Quality Formulation Examples 1, 2, 3, 4, and Comparative Formulation Examples 1, 2, 3, 4 and 5

Table 1a summarizes the coating and via filling results for Formulation Examples 2, 3 and 4.

Examples 1a and 1b which contained the 9,9'-Bis(4-hydroxyphenyl) fluorene, showed that coating quality has improved by increasing the amount of this additive which suppressed the surface roughness seen at lower levels.

Formulation examples 2a (PHSMMA), 3 (PHS) and 4a (THTPM) all showed good coating quality on silicon wafer with the exception of the sample containing 25 wt. % when baked at 250° C. for 60 s. However, PHS based formulations only showed rough or textured surface if a lower bake temperature was employed, and the roughness could be eliminated by using a higher bake temperature (Table 1a).

The comparative formulation examples 1, 2, 3, 4, and 5 were where TSA was formulated with hydroxy containing compounds which were not described by structure (I). Table 1b summarizes the via filling and coating results for the comparative samples tested. Comparative formulation example 1 containing polyacrylic acid showed good film coating quality when films were baked at temperature ranging from 240° C. to 300° C. (Table 1b). However, it did not show good via filling performance on patterned substrates (Table 1b). Comparative formulation example 2 (NP) did not show good film quality and gave films which showed a hazy color. Comparative formulation example 3(DHPB), 4(B2N) and 5(SPN560) when baked at 300° C./60 s showed much outgassing and gave very poor film quality.

Via Filling Performance Evaluation Example Formulations 1, 2, 3, and 4

Table 1a summarizes the via fill behavior of formulations 2, 3, and 4.

Solutions of formulation examples 1, 2, 3 and 4 with the adjusted solid content targeting final film thickness of 250 nm were spin-coated on a deep via substrate patterned wafer with trench size of 600 nm to 650 nm (depth) 70 nm to 100 nm (width) and line/space (L/S) 1:1 at a spin speed of 1500 rpm. The coated wafer was subsequently baked at 250° C./60 s to 600° C./60 s. The cross-section scanning electron microscope (XSEM) data showed excellent film coating quality and good filling performances. All initial via filling testing was done on these patterned surfaces with formulation coated as described above and baked at 300° C. for 60 s.

Formulation example 1 (9,9'-Bis(4-hydroxyphenyl) Fluorene) showed good via filling when baked at 300° C./60 sec. Formulation example 2a (PHSMMA) was tested at 250° C., and 350° C./60 s for via filling. Formulation 2a (PHSMMA) and 3(PHS) during via filling showed some voids when tested at low temperature 250° C., but gave good via filling results when they were tested at high bake temperature (350° C.). The formulation example 4a (THTPM) had good via filling properties, showing no voids when baked at 250° C./60 s. 300° C./60 s or 350° C./60 s. Also, the film coating quality, and via filling for formulation containing PHSMMA, HS or THTPM were compared by changing the amount of these organic additives in the formulation with tungstosilicic acid from 5 wt % to 45 wt % of total solids. In these experiments, formulations containing PHSMMA, or HS also gave good film quality when higher amount (33 to 45%) of these materials was employed in the formulation with TSA. However, these higher levels of PHSMMA or HS gave some voids at 250° C. bake condition, but gave void free good via filling under the 350° C. bake conditions. Formulations containing THTPM gave good film quality, via fillings at lower levels of this additive (20 wt %) even when tested at the lower bake temperature of 250° C./60 s. However, below 20 wt % of THTPM the coating films become hazy. These results are summarized in Table 1a.

Trench Filling Performance Formulation 4b, 4c

The solution of formulation example 4b, 4c with the adjusted solid content targeting final film thickness of 110 nm was spin-coated on a patterned wafer with trench size of 80 nm was spin-coated on a patterned wafer with trench size of 70 nm (depth) 35 nm (width) and L/S 1:1 at a spin speed of 1500 rpm. The coated wafer was subsequently baked at 220° C./60 s, 250° C./60 s. The X-SEM data showed good trench filling behavior, no voids where detected and the film quality was good.

Via Filling Performance Evaluation Comparative Formulations 1, 2, 3, 4, and 5

In contrast, none of the comparative formulations 1-5 gave good via filling properties regardless of the level of the components present, or the bake temperature employed (Table 1b and specific examples described above). Specifically, formulations of TSA containing hydroxy compounds other than those described by structure (I) such as 1,1'-Bis-2-naphthol, 2,2'-Dihydroxybiphenyl, poly(acrylic acid) 4-Nonylphenol and Novolak polymer do not impart good via filling properties. Moreover, most of these materials gave poor coatings even on non-patterned substrates. The only exceptions were some formulations containing PAA, however, none of the PAA containing formulation gave good via filling properties regardless of the loading present or bake temperature employed. Table 1b summarizes these results.

TABLE 1a

Comparison of hydroxyl compounds of Structure (I) in formulations with TSA for via filling at different temperatures

| Tungstosilicic acid, wt % Total Solids | 4-hydroxyphenyl compound | 4-hydroxyphenyl compound Wt % Total Solids | Coating Quality at 250° C./60 s | Via Fill at 250° C./60 s | Coating Quality at 350° C./120 s | Via Fill at 350° C./120 s |
|---|---|---|---|---|---|---|
| 95 | PHSMMA | 5 | — | — | Hazy | — |
| 85 | PHSMMA | 15 | — | — | Good | voids |
| 80 | PHSMMA | 20 | — | — | Good | voids |
| 75 | PHSMMA | 25 | — | — | Good | voids |
| 70 | PHSMMA | 30 | — | — | Good | few voids |
| 67 | PHSMMA | 33 | Good | Bad | Good | Good |
| 65 | PHSMMA | 35 | Good | Bad | Good | Good |
| 55 | PHSMMA | 45 | Good | Bad | Good | Good |
| 95 | PHS | 5 | — | — | Hazy | — |
| 85 | PHS | 15 | — | — | Good | small voids at bottom |
| 80 | PHS | 20 | — | — | Good | small voids at bottom |

TABLE 1a-continued

Comparison of hydroxyl compounds of Structure (I) in formulations with TSA for via filling at different temperatures

| Tungstosilicic acid, wt % Total Solids | 4-hydroxyphenyl compound | 4-hydroxyphenyl compound Wt % Total Solids | Coating Quality at 250° C./60 s | Via Fill at 250° C./60 s | Coating Quality at 350° C./120 s | Via Fill at 350° C./120 s |
|---|---|---|---|---|---|---|
| 75 | PHS | 25 | Slightly Rough | Bad | Good | Good |
| 65 | PHS | 35 | Good | Bad | Good | Good |
| 55 | PHS | 45 | Good | Bad | Good | Good |
| 95 | THTPM | 5 | Hazy | — | Hazy | N/A |
| 85 | THTPM | 15 | Slightly Hazy | — | Good | good but film quality is bad |
| 80 | THTPM | 20 | Good | Good | Good | Good |
| 75 | THTPM | 25 | Good | Good | Good | Good |
| 65 | THTPM | 35 | Good | Good | Good | Good |
| 55 | THTPM | 45 | Good | Good | Good | Good |

TABLE 1.b

Comparison of hydroxyl compounds not having Structure (I) in formulations with TSA for via filling at different temperatures

| Tungstosilicic acid, wt % Total Solids | Hydroxyl compound name | Hydroxyl compound, Wt % Total Solids | Coating Quality at 250° C./60 sec | Via Fill at 250° C./60 s | Coating Quality at 350° C./120 s | Via Fill at 350° C./120 s |
|---|---|---|---|---|---|---|
| 80 | PAA | 20 | Hazy | — | Hazy | — |
| 75 | PAA | 25 | Hazy | Bad | Good | Voids |
| 65 | PAA | 35 | Good | Bad | Good | Voids |
| 75 | NP | 25 | Hazy | Bad | Hazy | Voids |
| 65 | NP | 35 | Hazy | Bad | Hazy | Voids |
| 75 | DHBP | 25 | Hazy | Bad | Hazy | Voids |
| 65 | DHBP | 35 | Hazy | Bad | Hazy | Voids |
| 75 | B2N | 25 | Hazy | Bad | Hazy | Voids |
| 65 | B2N | 35 | Hazy | Bad | Hazy | Voids |
| 80 | SPN-560 | 20 | — | — | Hazy | — |
| 75 | SPN-560 | 25 | Hazy, cracked film | — | Hazy, cracked film | — |
| 66.6 | SPN-560 | 33.3 | Hazy, cracked film | — | Hazy, cracked film | — |

Refractive Index:

The refractive index (n) and extinction coefficient (k) of a 21.65 nm thick film of example 2 baked at 300° C./60 s were respectively 1.7326, 0.56223 at a wavelength of 193 nm.

Film Thickness Change at Different Bake Temperatures:

Although formulation example 2a had a poor via fill performance at 250° C./60 s, its performance was greatly improved by baking at 350° C./120 s. The 18% thickness change at 600° C./120 s was similar to what was observed for the initial two step bake (250° C./60 s+350° C./60 s) or one step bake of 350° C./120 s. Formulation Example 3 had good via fill performance at 350° C./120 s. The thickness change for this formulation at 600° C./120 s was 15%.

Formulation example 4a had good via fill performance at 250° C./60 s or 350° C./120 s. Thickness changes from two step bake (250° C./60 s+350° C./60 s) and one step bake (350° C./120 s) to 600° C./120 s were 15% and 11% respectively. Example 4a had good via fill performance as well as the least shrinkage at one step bake (350° C./120 s) among all the samples tested. Table 2 and 3 describe the measuring conditions and the film shrinkage associated with the various organic additives added to tungstosilicic acid.

TABLE 2

Film thickness change at different bake temperatures

| Organic Additive to TSA | Bake Process | RTA (Rapid Thermal Annealing) Chamber | RTA Temp Profile in N$_2$ | Film Shrinkage after holding for 2 min @600° C. | Film Shrinkage after holding for 5 min @600° C. | Film Shrinkage after holding for 10 min @600° C. |
|---|---|---|---|---|---|---|
| PHSMMA | 250° C./60 s + 350° C./60 s | Vacuum | Ramp-up to 600° C. | 18% | 18% | 13% |
|  | 350° C./120 s |  |  | 18% | 18% | 10% |

TABLE 2-continued

Film thickness change at different bake temperatures

| Organic Additive to TSA | Bake Process | RTA (Rapid Thermal Annealing) Chamber | RTA Temp Profile in $N_2$ | Film Shrinkage after holding for 2 min @600° C. | Film Shrinkage after holding for 5 min @600° C. | Film Shrinkage after holding for 10 min @600° C. |
|---|---|---|---|---|---|---|
| PHS | 350° C./120 s | | | 15% | 17% | 7% |
| THTPM | 250° C./60 s + 350° C./60 s | | | 15% | 13% | 10% |
| | 350° C./120 s | | | 11% | 14% | 0% |

TABLE 3

Detailed RTA Recipe

| Under | Recipe | Time | Rate |
|---|---|---|---|
| Vacuum | vacuum (AP → 1.0 Pa) | 30 sec | |
| | Hold | 30 sec | |
| | Ramp-up | 6 min | 100° C./min |
| | Hold | 2 min | — |
| | Cooling | 10 min | 30° C./min |
| N2 | $N_2$ blow (1.0 Pa → AP) | 30 sec | |

Etch Rate for Coatings Prepared Based on Formulation and Coating

Coating Example 2a in $CHF_3$ and $O_2/Ar$ Etch Gasses

Formulations of Example 2a which containing 17 wt. % of solids in solution were prepared as described above for etch rate testing. The coated silicon wafers were then heated on a hot plate for 1 minute at 300° C. AZ® AX2110P photoresist (available from AZ® Electronic Materials USA Corp, 70 Meister Ave, Somerville, N.J. 08876, USA) was coated on silicon wafers and baked for 1 minute at 100° C. and employed as a reference for the etching experiments. All etch experiments were carried out without non patterned photoresist on top using a NE-5000N(ULVAC) etcher. Table 4 summarizes the etching conditions employed with this etcher.

The etch rates of various materials were measured using the etcher and aforementioned etching conditions are summarized in Table 5. Table 5 compares films formed from formulation 2 containing PHSMMA to other materials including AZ® AX2110P, thermal oxide ($SiO_2$) and a film of a high carbon film AZ® U98-300 Coating (available from AZ® Electronic Materials USA Corp, 70 Meister Ave, New Jersey 08876, USA) (baked at 350° C. for 180 s).

TABLE 4

| RF POWER | 500 W (ISM)/250 W (Bias) | RF POWER | 700 W (ISM)/200 W (Bias) |
|---|---|---|---|
| Gas Flow | $CHF_3$ = 50 sccm | Gas Flow | $O_2/Ar$ = 30/25 sccm |
| Pressure | 20 mTorr | Pressure | 30 mTorr |
| Etching Time | 30 sec | Etching Time | 300 sec |
| Back He Temp | 20° C. | Back He Temp | 20° C. |

TABLE 5

| | Etch rate (nm/min) | | Selectivity Etch rate ratio of resist to different Materials | | Etch rate ratio of U98 etch to different materials | |
|---|---|---|---|---|---|---|
| Material | $CHF_3$ | $O_2/Ar$ | $CHF_3$ | $O_2/Ar$ | $CHF_3$ | $O_2/Ar$ |
| AX2110P | 154 | 1057.1 | 1.00 | 1.00 | 0.46 | 0.70 |
| Thermal Oxide | 118.4 | 2.7 | 1.30 | 392 | 0.60 | 275 |
| U98 | 70.7 | 742.8 | 2.18 | 1.42 | 1.00 | 1.00 |
| Formulation 2 (PHSMMA) | 155.1 | 10 | 0.99 | 106 | 0.46 | 74.00 |

As shown in Table 5, the etch rates of a coated sample of formulation 2 containing PHSMMA were much lower than that of photoresist or the high carbon material U98 in $O_2/Ar$. Also, the Etch Rate Ratios of resist AZ®2110P to a film of formulation 2 for oxygen, demonstrates the resistance of the novel materials of this invention towards an oxygen based plasma. Furthermore, the Etch selectivities listed in Table 5 as measured by comparison to either the resist or the carbon underlayer material demonstrates that a film of formulation 2 has high etch resistance in oxygen while maintaining a high etch rate in a fluorine based plasma comparable to that of a resist such as AZ® AX2110P. This indicates that the metal containing composition of this invention can be used as a hardmask in pattern transfer from resist to substrate. The good etch behavior of these novel admixtures, compatibility with standard film casting solvents such as PGMEA/PGME, good coating properties, good filling properties, low volume loss during baking, and good stability in solution even in the presence of moisture are an unexpected coupling of desirable properties.

Cross Linkable Tungstosilicic Acid Formulations:

The solutions of formulation containing PHSMMA, example 2c, and 2d in which crosslinkers were present were evaluated for film resistance to spin casting solvents and aqueous base developers which is an important property for underlayer applications such as antireflective coatings and also hard mask applications. The soak test were done with formulation of TSA containing PHSMMA with and without a cross linking additive. The samples compared were Formulation Examples 2a (no crosslinker), and Examples 2c and 2d (both with crosslinker additives). Formulation example 2a which showed coatings of uniform film thickness, was baked at 300° C./60 s and soaked with either a PGMEA/PGME mixture (70/30) (ArF thinner) or a AZ 300 MIF developer for 60 s. The treatment with the Arf thinner caused a film loss of ~35% while treatment with the developer caused completely film loss. Formulation example 2c also showed good film uniformity after baking baked at 300° C./60 s. This sample gave no detectable film thickness change after the sample was baked at 300° C./60 s and soaked with PGMEA/PGME mixture (ArF thinner) for 60 s, and only a small film thickness loss observed after soak test in AZ 300 MIF developer (film loss ~2.32%). Similar results were observed with Formulation Example 2d which showed a slight film (2.5%) loss with PGMEA/PGME mixture (ArF thinner) for 60 s and a 6.6% film loss observed after the soak test in AZ 300 MIF developer. These results indicated that crosslinkers help to prevent film loss with either a spin casting solvent such as ArF thinner or an aqueous base developer such as AZ 300 MIF developer. The film thickness, initial, after soak test with ArF thinner, AZ MIF300 developer for 60 s summarized in Table 6.

TABLE 6

Crosslinking agents

| Composition | Initial, °A | Final after ArF-Thinner soak, °A | Change (°A) | % loss | Final after AZ 300 MIF soak, °A | Change | % loss |
|---|---|---|---|---|---|---|---|
| 75% TSA, 25% PHSMMA, 15% TMOM-BP, 2% DBSA/E, 100% PGMEA/PGME solvent | 3095 | 3120 | 25 | 0.80775 | 3167 | 72 | 2.32633 |
| 75% TSA, 25% PHSMMA, 15% XL-CHTA-BVEx-linker, 2% DBSA/E, 100% PGMEA/PGME solvent | 2807.5 | 2877.5 | 70 | 2.49332 | 2992.5 | 185 | 6.589 |

Summary of Unexpected Results

It was found that when blending tungstosilicic acid with organic compounds containing a hydroxyl functional group only those having structure (I) or its analogs where n is a positive integer which is 1 or greater were able to form coatings which provided good coating properties needed for a via and trench filling filing material.

Specifically, hydroxyl bearing compounds such polyacrylic acid, 4-hydroxyphenyl compounds in which only one 4-hydroxyphenyl moiety (e.g 4-nonylphenol), or phenolic compounds in which the substitution patterns is other than para are present (e.g. 2,2'-dihydroxybiphenyl, 1,1'-bis-2-naphthol and novolak) give poor film properties which preclude their use as a via fill material. While not bound by theory it is believed that compounds bearing multiple 4-hydroxyphenyl moieties are much better at complexing with tungstosilicic acid. Specifically, the compounds having structure (I) have multiple 4-hydroxyphenyl groups which offer both good Lewis base and Lewis acid complexing ability while at the same time offering little steric hindrance towards these interactions and also offering the possibility of multiple interactions with tungstosilicic acid because more than one 4-hydroxyphenyl moiety is present.

Also, it was found that coupled with these desirable coating and via/trench filling properties, films of TSA containing 4-hydroxyphenyl compounds of structure (I) also have desirable plasma etch properties compatible with a good hard mask material, good compatibility with spin casting solvents, good solution stability to moisture and low volume loss during baking.

We claim:

1. A composition which is an admixture comprising;
   (a) metallosilicic acid, wherein the amount of metallosilicic acid in the admixture ranges from about 55 wt % to about 95 wt % of total solids;
   b) at least one compound comprising two or more 4-hydroxyphenyl groups, wherein the attachment point of the phenyl moiety to other moieties is located para to the hydroxyl substituent and no substituents are located ortho to the hydroxyl substituent on the phenyl group; and,
   c) a solvent,
   wherein the compound comprising two or more 4-hydroxyphenyl groups is chosen from the group consisting of i), ii), iii), iv) and mixtures thereof, wherein, i) is a 4-hydroxyphenyl containing polymer comprising repeat unit of structure (II);

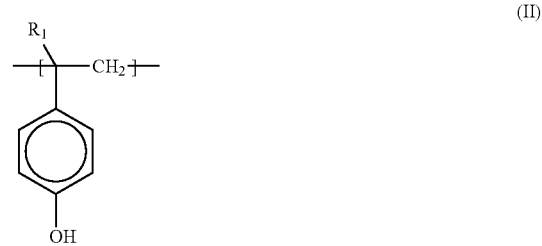

(II)

wherein $R_1$ is chosen from hydrogen or $C_1$-$C_4$ alkyl, and wherein the 4-hydroxyphenyl containing polymer further comprises repeat units chosen from the group consisting of structure (VI) and (VII) wherein $R_5$ and $R_7$ are independently chosen from $C_1$-$C_4$ alkyl and $R_6$ and $R_8$ are independently chosen from the group consisting of $C_1$-$C_8$ alkyl, $C_3$-$C_{12}$ branched alkyl, $C_3$-$C_8$ cycloalkyl, $C_6$-$C_{12}$ alicyclic alkyl, acid labile group and mixtures thereof

(VI)

-continued

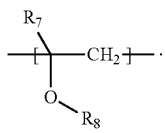

(VII)

ii) is a 4-hydroxyphenyl containing compound having structure (III),

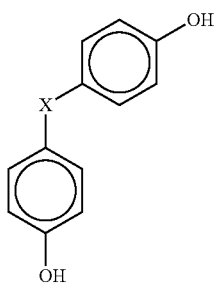

(III)

wherein X is chosen from a group selected from a direct valence bond, phenylene, $C_1$-$C_8$ linear or branched alkylene, $C_3$-$C_8$ cycloalkylene, sulfone, acetylene, oxygen, carbonyl and mixtures thereof;

iii) is a 4-hydroxyphenyl containing compound having structure (IV),

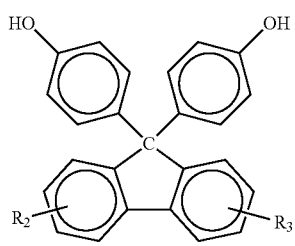

(IV)

wherein $R_2$ and $R_3$ are independently chosen from the group consisting of hydrogen, $C_1$-$C_8$ alkyl, $C_3$-$C_{12}$ branched alkyl, $C_3$-$C_8$ cycloalkyl, $C_6$-$C_{12}$ alicyclic alkyl and mixtures thereof; and, iv) is a 4-hydroxyphenyl containing compound having structure (V),

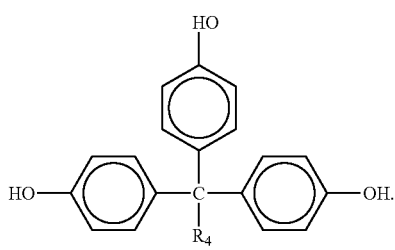

(V)

wherein $R_4$ is chosen from the group consisting of hydrogen, $C_1$-$C_8$ alkyl, $C_3$-$C_{12}$ branched alkyl, $C_3$-$C_8$ cycloalkyl $C_6$-$C_{12}$ alicyclic alkyl, phenyl, 4-hydroxyphenyl and mixtures thereof.

2. The composition of claim 1 where the 4-hydroxyphenyl containing polymer has structure (VIIIa), where x and y represent the mole fraction of the repeat units

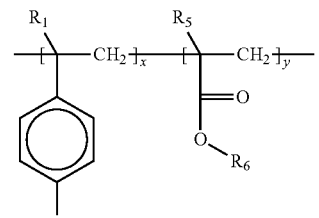

(VIIIa)

3. The composition of claim 2 wherein $R_1$ is hydrogen and $R_5$ is hydrogen or methyl and $R_6$ is a $C_1$-$C_4$ alkyl.

4. The composition of claim 1 where the solvent is chosen from the group consisting of ($C_1$-$C_6$)alcohols, glycols, diketones, glycol ether derivatives, glycol ether ester derivatives, carboxylates, carboxylates of di-basic acids, hydroxy carboxylates, ketone esters, alkoxy alcohols, alkoxycarboxylic acid esters, ketone derivatives, ketone ether derivatives, ketone alcohol derivatives, lactones, amide derivatives, aromatic solvents, and mixtures thereof.

5. The composition of claim 1, further comprising at least one of a thermal acid generator, a thermal base generator or a thermally activated peroxide.

6. The composition of claim 1, further comprising a crosslinking additive.

7. A composition which is an admixture comprising:
(a) metallosilicic acid, wherein the amount of metallosilicic acid in the admixture ranges from about 55 wt % to about 95 wt % of total solids;
b) at least one compound comprising two or more 4-hydroxyphenyl groups, wherein the attachment point of the phenyl moiety to other moieties is located para to the hydroxyl substituent and no substituents are located ortho to the hydroxyl substituent on the phenyl group; and,
c) a solvent,
wherein the compound comprising two or more 4-hydroxyphenyl groups is 8. The composition of claim 7 where the solvent is chosen from the group consisting of ($C_1$-$C_6$)alcohols, glycols, diketones, glycol ether derivatives, glycol ether ester derivatives, carboxylates, carboxylates of di-basic acids, hydroxy carboxylates, ketone esters, alkoxy alcohols, alkoxycarboxylic acid esters, ketone derivatives, ketone ether derivatives, ketone alcohol derivatives, lactones, amide derivatives, aromatic solvents, and mixtures thereof.

9. The composition of claim 7, further comprising at least one of a thermal acid generator, a thermal base generator or a thermally activated peroxide.

10. The composition of claim 7, further comprising a crosslinking additive.

11. A composition which is an admixture comprising:
(a) metallosilicic acid, wherein the amount of metallosilicic acid in the admixture ranges from about 55 wt % to about 95 wt % of total solids;
b) at least one compound comprising two or more 4-hydroxyphenyl groups, wherein the attachment point of the phenyl moiety to other moieties is located para to the hydroxyl substituent and no substituents are located ortho to the hydroxyl substituent on the phenyl group; and,
c) a solvent
wherein the compound comprising two or more 4-hydroxyphenyl groups is

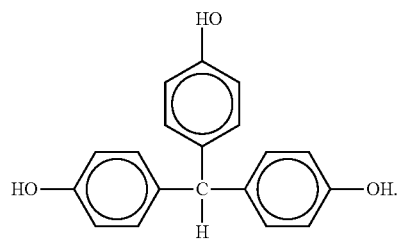

12. The composition of claim 11 where the solvent is chosen from the group consisting of $(C_1-C_6)$alcohols, glycols, diketones, glycol ether derivatives, glycol ether ester derivatives, carboxylates, carboxylates of di-basic acids, hydroxy carboxylates, ketone esters, alkoxy alcohols, alkoxycarboxylic acid esters, ketone derivatives, ketone ether derivatives, ketone alcohol derivatives, lactones, amide derivatives, aromatic solvents, and mixtures thereof.

13. The composition of claim 11, further comprising at least one of a thermal acid generator, a thermal base generator or a thermally activated peroxide.

14. The composition of claim 11, further comprising a crosslinking additive.

* * * * *